United States Patent
Prey, Jr. et al.

(10) Patent No.: US 7,148,712 B1
(45) Date of Patent: Dec. 12, 2006

(54) PROBE FOR USE IN DETERMINING AN ATTRIBUTE OF A COATING ON A SUBSTRATE

(75) Inventors: John E. Prey, Jr., Tower Lakes, IL (US); Joseph Tom, Bartlett, IL (US)

(73) Assignee: Oxford Instruments Measurement Systems LLC, Elk Grove Village, IL (US)

( * ) Notice: Subject to any disclaimer, the term of this patent is extended or adjusted under 35 U.S.C. 154(b) by 0 days.

(21) Appl. No.: 11/166,560

(22) Filed: Jun. 24, 2005

(51) Int. Cl.
*G01R 31/02* (2006.01)

(52) U.S. Cl. .................. 324/754; 324/72.5; 324/765

(58) Field of Classification Search ............... 324/754, 324/770, 72.5, 133
See application file for complete search history.

(56) References Cited

U.S. PATENT DOCUMENTS

| | | | | |
|---|---|---|---|---|
| 3,253,338 | A * | 5/1966 | Burnette, Jr. ................ | 33/558 |
| 3,681,724 | A * | 8/1972 | Shepard ...................... | 335/207 |
| 4,168,873 | A * | 9/1979 | Luna .......................... | 439/391 |
| 4,504,780 | A * | 3/1985 | Marsella .................... | 324/72.5 |
| 5,200,695 | A * | 4/1993 | Kazama ...................... | 324/757 |
| 6,222,378 | B1 * | 4/2001 | Campbell et al. ............ | 324/754 |
| 6,242,930 | B1 * | 6/2001 | Matsunaga et al. ......... | 324/754 |

OTHER PUBLICATIONS

Drawing No. 51-84-0014-00001 Revision D Sheet 1 of 3, Mar. 20, 2005.
Drawing No. 51-84-0014-00001 Revision D Sheet 2 of 3, Mar. 20, 2005.
Drawing No. 51-84-0014-00001 Revision D Sheet 3 of 3, Mar. 20, 2005.
Drawing No. 51-84-0015-00000 Revision A Sheet 1 of 3, Mar. 4, 2005.
Drawing No. 51-84-0015-00000 Revision A Sheet 2 of 3, Mar. 4, 2005.
Drawing No. 51-84-0015-00000 Revision A Sheet 3 of 3, Mar. 4, 2005.
Drawing No. 51-65-0035-00083P Revision A Sheet 1 of 1, Mar. 4, 2005.

* cited by examiner

*Primary Examiner*—Jermele Hollington
*Assistant Examiner*—Arleen M. Vazquez
(74) *Attorney, Agent, or Firm*—Wood, Phillips, Katz, Clark & Mortimer

(57) ABSTRACT

A probe provides electrical communication between a coating and a processing system. One optional feature includes an outwardly projecting, electrically conductive engaging member that is held in a captivation structure releasably retained in a housing and engages a contact that is inside the probe and connected with the processing system. Another optional feature of the probe provides the electrically conductive engaging member in the form of a pin or pins captivated in a light-transmissive structure adjacent a light-emitting source. Another optional feature of the probe includes a restraining structure that defines a frustoconical seat for engaging a conical distal end of an electrically conductive pin that is adapted to contact the coating.

38 Claims, 18 Drawing Sheets

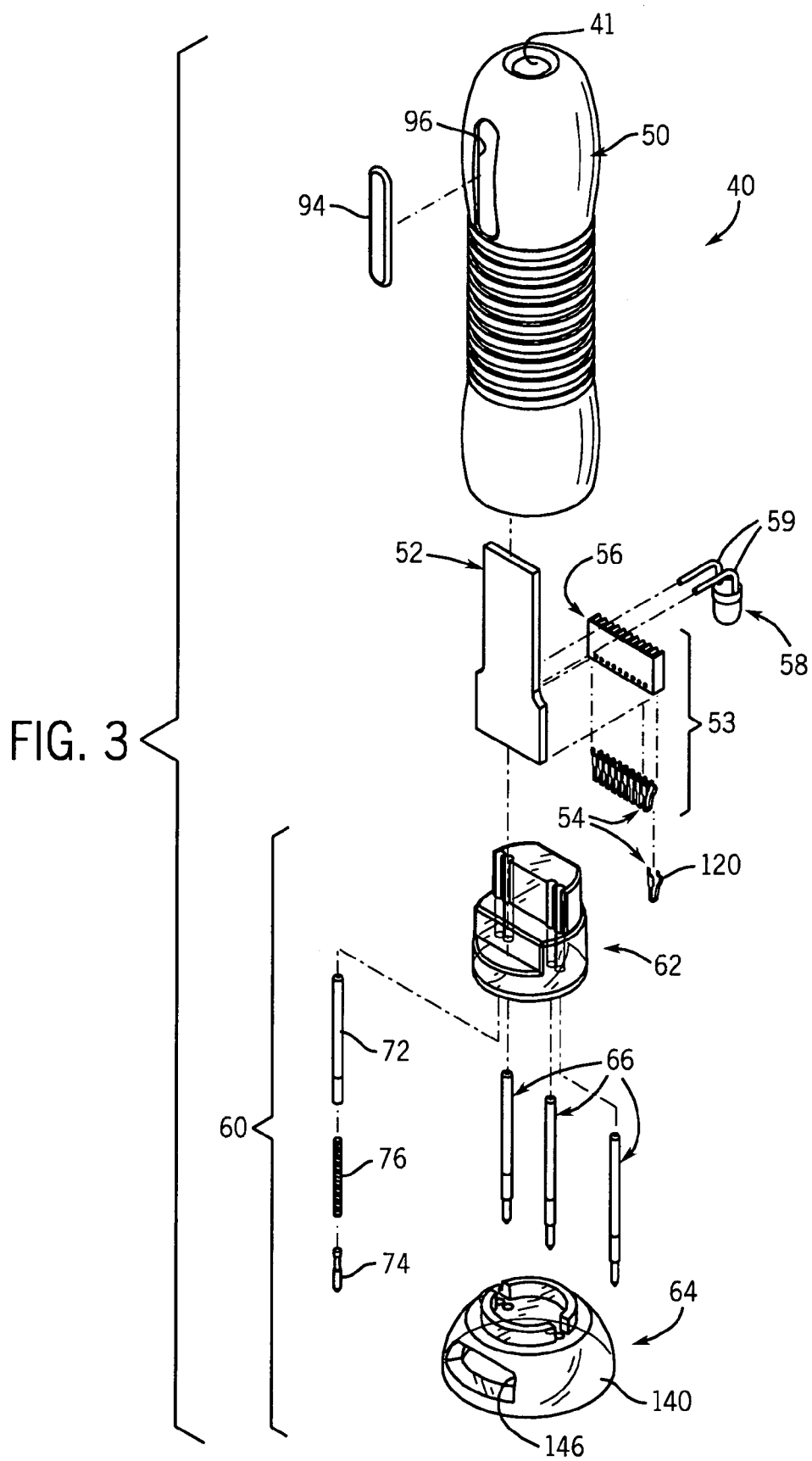

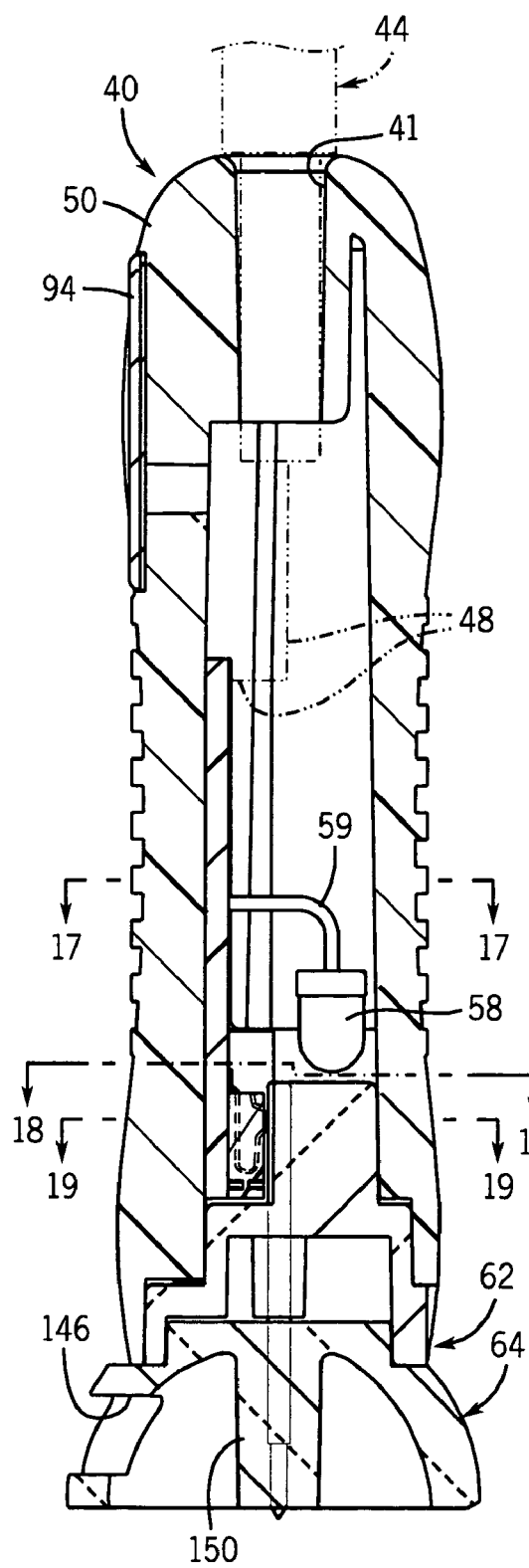
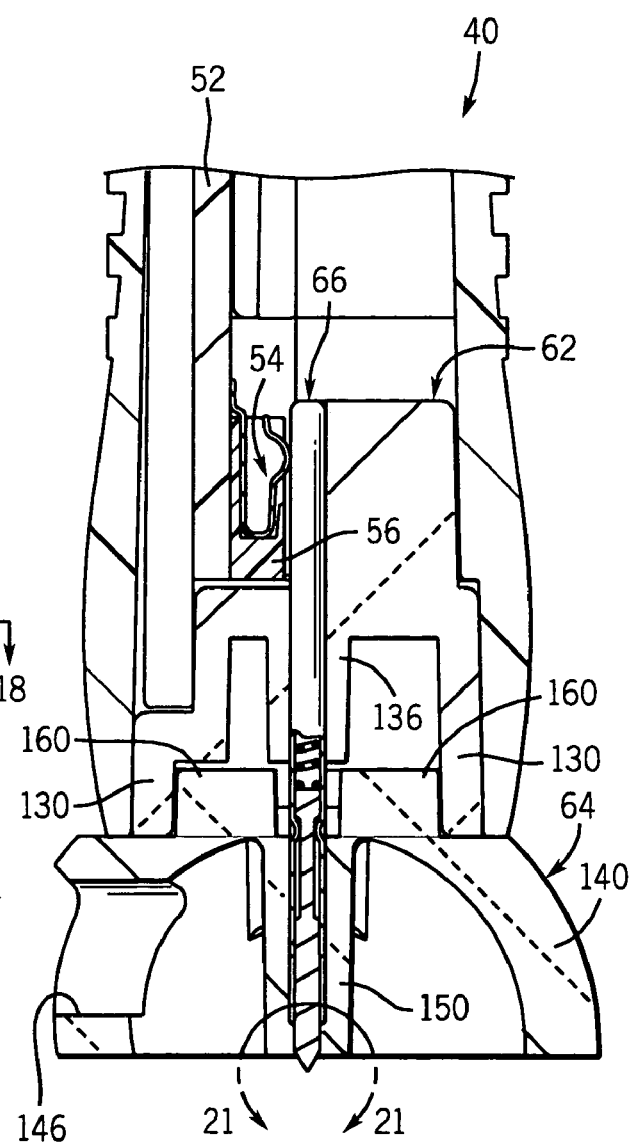
FIG. 14
FIG. 16

PROBE FOR USE IN DETERMINING AN ATTRIBUTE OF A COATING ON A SUBSTRATE

CROSS REFERENCE TO RELATED APPLICATION(S)

None.

STATEMENT REGARDING FEDERALLY SPONSORED RESEARCH OR DEVELOPMENT

None.

REFERENCE TO A MICROFICHE APPENDIX

None.

TECHNICAL FIELD

This invention relates to a probe for providing electrical communication between a material (e.g., a coating defined by a film or layer on a substrate) and a processing system (e.g., analyzing system) that determines an attribute of the material (e.g., the thickness of a coating) by analysis of detected or sensed phenomena in the material (e.g., an electrical characteristic temporarily established in the material as a result of the application of electrical energy to the probe near, or in contact with, the material).

BACKGROUND OF THE INVENTION AND TECHNICAL PROBLEMS POSED BY THE PRIOR ART

Some attributes (i.e., characteristics or features) of a material can be determined (e.g., measured) with an appropriate instrument. For example, various models of instruments for non-destructively measuring the thickness of a film or layer (i.e., coating) of copper as electroplated on a printed circuit board are sold by Oxford Instruments Coating Measurement, a part of the Oxford Instruments Analytical division of Oxford Instruments plc (hereinafter referred to as "Oxford"), which has a place of business at 945 Busse Road, Elk Grove Village, Ill. 60007, U.S.A. Typically, during the manufacture of a printed circuit board, it is desirable to know whether or not the design specifications are being met by, inter alia, the copper coating(s) on a substrate component of the printed circuit board. In particular, it typically is important to know the thickness of the copper coating(s) within some sufficient range of precision and accuracy in order for the manufacturer to determine whether or not the copper thickness on a portion or portions of the printed circuit board is within the allowable manufacturing tolerances as established by the design.

Different systems can be employed in an instrument to measure a feature, such as a coating thickness. These systems can include, for example, the use of a probe employing magnetic induction, eddy currents, or micro-resistance methods or techniques. Selection of the technique to be employed can depend on various factors (e.g., the type of coating material, geometric configuration of the coating and substrate, desired accuracy and precision, size of the area being measured, range of thickness to be measured, efficiency of use, ambient environmental conditions, and cost). Such a probe may employ one or more contact members for engaging the coating, and the probe may be a separate, hand-held probe, or may be mounted in a stationary device.

Although Oxford markets probes that are designed for various applications and that function exceptionally well in systems efficiently performing measurement analyses (such as measurement of a coating thickness), it would be desirable to provide improved probe features that would result in, or accommodate, even better performance, greater functionality, more versatility, ease of use, ease of manufacturing, lower cost manufacture, and/or improvement in accuracy, precision, efficiency of use, tolerance of ambient environmental conditions, and durability.

It would be particularly advantageous to provide an improved probe that optionally could be selectively configured with a different tip geometry to maximize accuracy and precision in various applications and/or that optionally could accommodate replacement of a worn or broken component.

It would also be beneficial to provide an improved probe permitting the user or operator to better observe the end of the probe and the adjacent portion of the material where the particular attribute of the material (e.g., thickness) is to be determined by the use of the probe.

Also, with a probe of the type that employs a pin or pins for engaging or contacting a material (e.g., a copper coating), it would be desirable to provide an improved probe that has greater pin stability so as to minimize deleterious effects on measurement precision.

The present invention provides an improved probe which can accommodate designs having one or more of the above-discussed benefits and features.

BRIEF SUMMARY OF THE INVENTION

Various aspects of the present invention can be incorporated in a portable or stationary probe that may include one or more of the above-discussed, desired features. According to a first aspect of the present invention, a probe provides electrical communication between a coating on a substrate and a processing system that determines an attribute of the coating (e.g., such as the thickness of the coating) by detection of phenomena resulting from the application of electrical energy to the probe in contact with the coating. The probe has one or more engaging members which can engage the coating and which can be readily removed by the user to allow replacement by the user if the electrically conducting engaging members become worn or damaged, or if it is desired to use new electrically conducting engaging members arranged in a different configuration and/or having different characteristics.

In particular, in the presently preferred embodiment which incorporates the first aspect of the invention, the probe comprises a housing and at least one contact mounted within the housing. The probe further includes an electrical circuit adapted to provide electrical communication between the contact and the processing system (which may be remote from the probe). The probe also includes at least one electrically conductive engaging member that (1) has a distal end projecting outwardly for engaging the coating, (2) has a proximal portion in the housing for engaging the contact and for accommodating disengagement from the contact, and (3) is captivated partially in an electrically insulating captivation structure which can be manually grasped by a user for removal from the housing together with the captivated electrically conductive engaging member.

In accordance with this first aspect of the invention, the presently preferred form of the electrically conductive engaging member is a pin which defines the distal end of the engaging member projecting outwardly for engaging the coating and which defines the proximal portion of the engaging member for engaging the contact. According to the first aspect of the invention, the presently preferred form of the probe captivation structure is molded or machined from a thermoplastic material having a hole or passage in which a portion of the pin is captivated to hold the pin in a fixed orientation. The pin and the captivation structure together define an integral unit in the form of a nose assembly which may be characterized as a probe tip that has (1) an inner portion that is releasably received in the housing, and (2) an extending portion that (a) projects from the housing, and (b) can be manually grasped by a user for pulling the tip out of the housing without using a tool.

Further, in the presently preferred form of a probe incorporating the first aspect of the invention, the housing is a hand-held or hand-holdable, tubular structure defining a receiving cavity with an access opening for accommodating insertion of the probe tip. Each contact is mounted in the receiving cavity of the housing and includes an arm that is elastically deflectable in response to a force exerted by the proximal portion of a pin which engages the contact arm.

In the presently preferred form of a probe incorporating the first aspect of the invention, a snap-fit engagement releasably retains the probe tip in the housing. To that end, the tubular structure of the housing has a peripheral wall that defines a slot having an enlarged recess and a reduced width opening to the recess. The pin captivation structure includes a tab having an enlarged head and a reduced width neck whereby the tab head can be forced into the enlarged recess of the slot so that the tab neck is received in the reduced width opening of the slot to create a releasable snap-fit engagement that holds the probe tip in the housing.

A second aspect of the invention relates to improved visibility of a portion of the probe that is located adjacent the coating. The probe has a housing having a receiving cavity with an access opening. The probe also has a light transmissive captivation structure that is mounted in the receiving cavity of the housing for communication through the receiving cavity access opening with the exterior of the probe. The probe further includes at least one electrically conductive pin that (1) has a portion captivated in a fixed orientation within the light transmissive captivation structure, (2) has a distal end projecting outwardly of the light transmissive captivation structure for engaging the coating, and (3) is connected with an electrical circuit adapted to provide electrical communication with the processing system. The probe also has a light emitting source in the housing for emitting light through the light transmissive captivation structure along the pin to illuminate the pin distal end. This permits the user to better observe the placement of the probe pin at a desired location on the coating.

According to a presently preferred embodiment of a probe incorporating this second aspect of the invention, the housing is a generally tubular, opaque structure, but the light transmissive captivation structure is molded from a transparent, thermoplastic material, such as polycarbonate, and is drilled to provide a hole or passage in which a portion of the pin is captivated and held in the desired fixed orientation. At least one contact is mounted in the tubular, opaque structure, and the contact is connected with the electrical circuit adapted to provide electrical communication with the processing system. The pin and the light transmissive captivation structure together define an integral unit in the form of a probe tip that has (1) an inner portion that is received in the housing so as to effect engagement between the pin and the contact, and (2) an extending portion that projects from the housing at the receiving cavity access opening. The tip may or may not be designed to be readily removable from the housing by the user.

A third aspect of the invention relates to a probe which uses a pin or pins to engage a coating and which provides better stabilization of the pin or pins. The probe provides electrical communication between the coating and a processing system wherein the processing system determines an attribute of the coating, such as the thickness of the coating, by detection of phenomena resulting from the application of electrical energy to the pin in contact with the coating.

The pin includes (1) a plunger having a shank with a conical distal end that is symmetric about a longitudinal axis and that is adapted to engage the coating, (2) a proximal portion that includes a barrel that receives at least a portion of the plunger in a telescoping relationship to accommodate reciprocation of the plunger in the barrel, and (3) a spring in the barrel for biasing the plunger outwardly.

According to this third aspect of the invention, the probe includes a captivation structure for holding the pin in a fixed orientation in the probe. The captivation structure includes (1) a barrel restraining structure for restraining the barrel of the pin against axial and lateral movement; and (2) a plunger restraining structure that (a) defines a frustoconical seat about an axis that is coincident with the longitudinal axis, and (b) engages the pin plunger shank conical distal end as the plunger is biased outwardly by the spring to provide stabilization of the distal end. The pin(s) and the captivation structure may or may not be designed to be readily removable as an integral unit from the probe and/or incorporate an illumination system.

The above-described invention first aspect or feature (i.e., probe component removability), second aspect or feature (i.e., probe illumination), and third aspect or feature (i.e., pin stabilization) of may be readily incorporated together in one probe. However, if desired, a probe of the present invention may include only a selected one or two of the three aspects or features of the invention.

Numerous other advantages and features of the present invention will become readily apparent from the following detailed description of the invention, from the claims, and from the accompanying drawings.

BRIEF DESCRIPTION OF THE DRAWINGS

In the accompanying drawings that form part of the specification, and in which like numerals are employed to designate like parts throughout the same, some of the drawing figures show darker lines and lighter lines wherein the lighter lines represent interior features visible through transparent outer features, and wherein

FIG. 2A shows both the probe tip and a printed circuit board assembly in an exploded view format prior to installation in the housing;

FIG. 3 is an exploded, isometric view of the probe as viewed from the front of the probe from substantially the same viewpoint as FIG. 1;

FIG. 11 shows some interior features in dashed lines;

FIG. 14 is an enlarged, cross-sectional view taken generally along the plane 14—14 through the center of the probe in FIG. 1;

FIG. 16 is a fragmentary, cross-sectional view taken generally along the plane 16—16 offset from the center of the probe in FIG. 1;

DETAILED DESCRIPTION

Figure 1:
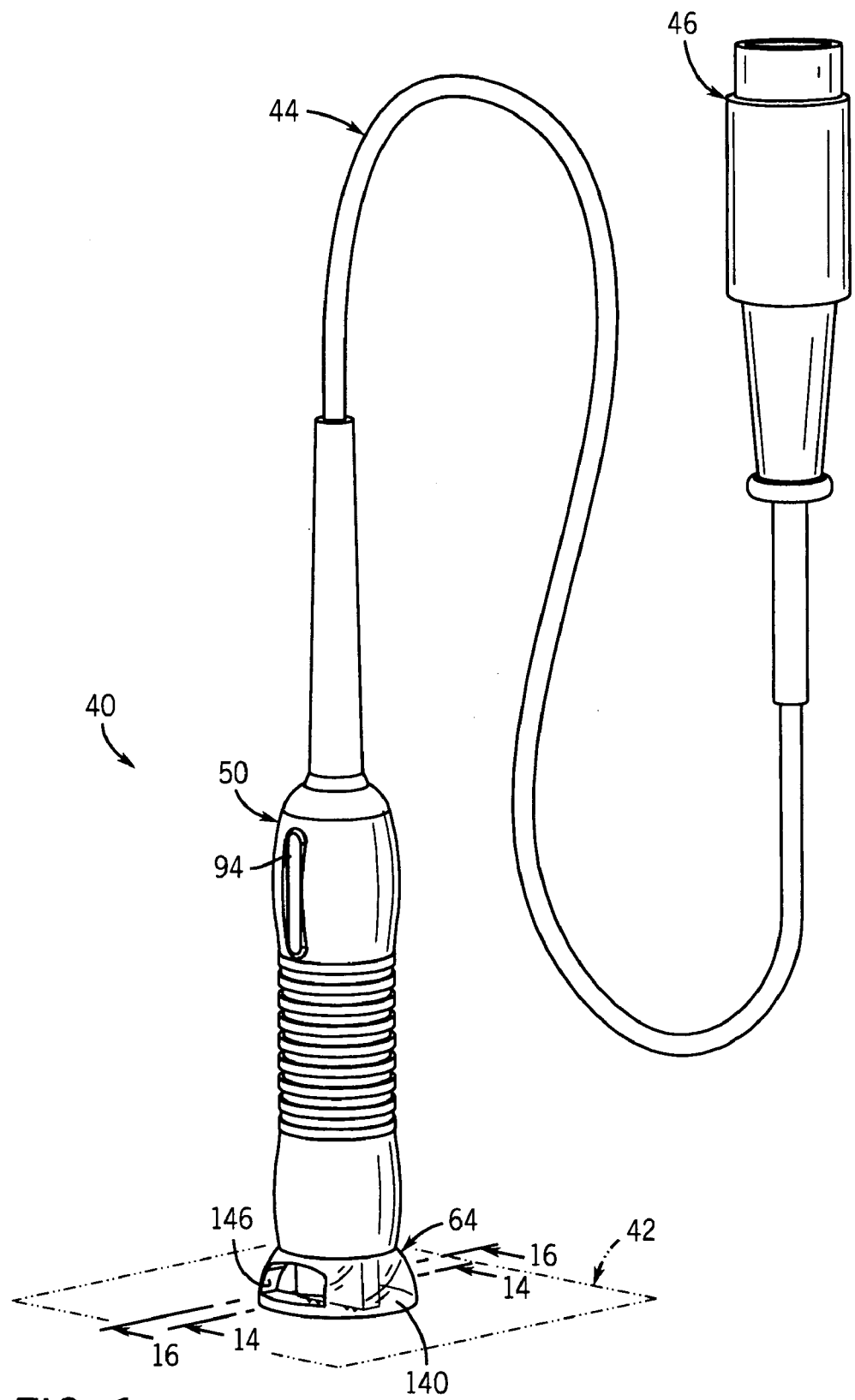
FIG. 1 is an isometric, front view of a probe incorporating features of the present invention wherein the probe is shown vertically disposed in contact with a coating having a thickness that is to be measured.

While this invention is susceptible of embodiment in many different forms, this specification and the accompanying drawings disclose only some specific forms as examples of the invention. The invention is not intended to be limited to the embodiments so described, however. The scope of the invention is pointed out in the appended claims.

For ease of description, the probe of this invention is described in the normal (upright) operating position, and terms such as upper, lower, horizontal, etc., are used with reference to this position. It will be understood, however, that the probe of this invention may be manufactured, stored, transported, used, and sold in an orientation other than the position described.

Figures illustrating the probe show some conventional electrical, mechanical, and structural elements that are known and that will be recognized by one skilled in the art. The detailed descriptions of such elements are not necessary to an understanding of the invention, and accordingly, are herein presented only to the degree necessary to facilitate an understanding of the novel features of the present invention.

The features of the present invention are especially suitable for use in a probe that is part of a system for measuring the thickness of a conductive material on a substrate, such as a coating of copper in a portion of an integrated circuit on a printed circuit board. The features of the present invention are hereinafter described as incorporated in a probe that is designed to be especially suitable for measuring the thickness of a copper coating using conventional resistance or micro-resistance techniques.

The American Society of Testing and Materials (ASTM) has promulgated standards that relate to resistance methods for determining thickness of some materials, and these include ASTM F 39098 and ASTM F 1529—02. The micro-resistance method of thickness measurement is a well-known technique employed in the printed circuit board industry to measure the thickness of copper on printed circuit boards. Conventional micro-resistance techniques for measuring the thickness of a coating of copper on a substrate typically employ a probe which has four, projecting, conductive prongs or pins which can be oriented generally perpendicular to the copper coating so as to readily engage the copper coating in substantially point contact. The pins are oriented in parallel and are spaced apart along a straight line. Each pin has a distal end point for engaging the copper coating. A constant current is maintained between the two outer pins when the pins are in contact with the copper coating. The voltage drop through the copper coating between the two middle pins is measured. The resistance is then calculated by applying Ohm's Law using the known constant current that is passing through the copper coating and using the measured voltage drop. The calculated resistance is then compared to the known relationship of copper resistivity versus thickness to determine the thickness of the measured copper coating. The calculation and thickness measurement comparison are performed automatically in a processing system which (1) is connected to the probe, (2)

establishes the current between the two outer pins, and (3) measures the voltage drop signal across the two inner pins.

Conventional instruments employing probes and the micro-resistance method are marketed in the United States of America, among other places, under the model designations SRP-1, SRP-2, and SRP-3 by Oxford (as more particularly identified above in the section entitled "BACKGROUND OF THE INVENTION AND TECHNICAL PROBLEMS POSED BY THE PRIOR ART"). Such probes are tethered by a cable to an electronic gauge (i.e., a combined signal processing and power supply unit) containing the processing system for determining the copper coating thickness with the above-discussed micro-resistance method. The conventional processing systems (which include the necessary power supply) employed by such instruments may also be employed with the improved probe of the present invention, and the detailed design and operation of such processing systems form no part of the present invention.

FIG. 1 shows a first, preferred embodiment of an improved probe 40 of the present invention in a normal, generally upright operating orientation wherein the probe 40 is in contact with a substrate having a coating 42 with a thickness that is to be measured, and the coating 42 is illustrated in FIG. 1 in a simplified, schematic representation. It is to be realized that the coating 42 may be a narrow line of copper in an integrated circuit on a portion of a printed circuit board.

The probe 40 has a bottom or front end for being placed on the coating 42 to be measured as shown in FIG. 1, and the probe 40 has a top or rear end with an opening or hole 41 (FIGS. 3, 11, and 14) from which a cable 44 extends for being connected to the electronic gauge (i.e., a combined signal processing and power supply unit) which contains the processing system which also typically includes a power supply and a display or read-out panel and controls. For convenience, such a combined signal processing and power supply unit will be hereinafter referred to simply as the base unit (not illustrated in the Figures). The detailed design and operation of such a base unit form no part of the present invention.

The cable 44 terminates in a pin connector 46 which may be of any suitable conventional or special design for connecting to the base unit which contains the processing system (that includes the power supply). In a contemplated, alternate embodiment (not illustrated), a power supply for providing electric current in the copper coating could be a battery mounted directly in the probe 40, and the probe 40 could include a wireless communication system for communicating with the base unit (e.g., "blue tooth" wireless technology). In such a contemplated embodiment, the base unit would then contain only the processing system (incorporating any necessary power supply, display panel, and controls). In another contemplated, alternate embodiment (not illustrated), the probe per se could be made large enough to contain the entire processing system (with power supply (e.g., a battery) so as to eliminate the need for a separate base unit and cable connection (or wireless connection). In yet another contemplated, alternate embodiment, the probe could be fixed within, or be part of, a much larger stationary or portable device containing the processing system (including the power supply, display panel, and controls).

In the illustrated preferred embodiment, the connector 46 and cable 44 contain a suitable wiring system defining part of an electrical circuit adapted to provide electrical communication between the probe 40 and the processing system of the base unit (not illustrated). The wiring system of the cable 44 extends into the inside of the probe 40 wherein the cable 44 is connected with one or more wires as are schematically represented in dashed dot lines 48 (FIG. 14). In the preferred embodiment of the invention as illustrated, the electric current can be supplied from the base unit through the cable 44 to the probe 40, and a signal corresponding to the voltage drop in the copper coating as detected by the probe 40 is communicated through the cable 44 to the base unit. The cable 44 may be of any suitable conventional or special design incorporating the necessary wires or other electrical conductors. The detailed design and construction of the cable 44 form no part of the present invention.

The main components of the probe 40 per se, will next be briefly described. As can be seen in FIG. 3, the main components of the presently preferred embodiment of the probe 40 include a housing 50 in the form of a tubular structure or barrel, a printed circuit board 52, and a connector 53 comprising a set of ten contacts 54 disposed in a contact holder or fixture 56 that is mounted to the printed circuit board 52.

In the preferred embodiment, the contact fixture 56 (that is part of the connector 53 and that holds the ten contacts 54) is an insulating component molded around, or otherwise capturing, the contacts 54. A presently preferred form of the contact 54 is made from phosphor bronze which is then gold plated. Suitable types of such ten-contact connectors 53 are sold in the United States of America under the model designation "SMT Surface Mount One-Piece Interface SEI Series" by Samtec U.S.A., having an internet business website at www.samtec.com, and having a post office address of P.O. Box 1147, New Albany, Ind. 47151-1147 U.S.A.

A light source 58, preferably in the form of a light-emitting diode (LED) 58, is also mounted to the printed circuit board 52. The printed circuit board 52, to which is mounted the LED 58 and the connector 53, is disposed inside the housing 50 as described in detail hereinafter. In the preferred embodiment, the housing 50 is molded from an opaque thermoplastic material, such as the opaque form of the material sold in the United States of America under the trade name or trademark LEXAN by General Electric Company which has a place of business at 3135 Easton Turnpike, Fairfield, Conn., 06828-0001, U.S.A. Other suitable materials may be employed instead.

The printed circuit board 52 contains conventional electronic circuits which, among other things, establish connections between the cable 44 and four of the ten contacts 54, control current to the LED 58, and provide some electrostatic discharge protection. Any specific detailed design and operation of such conventional circuits form no part of the present invention.

Figure 23:
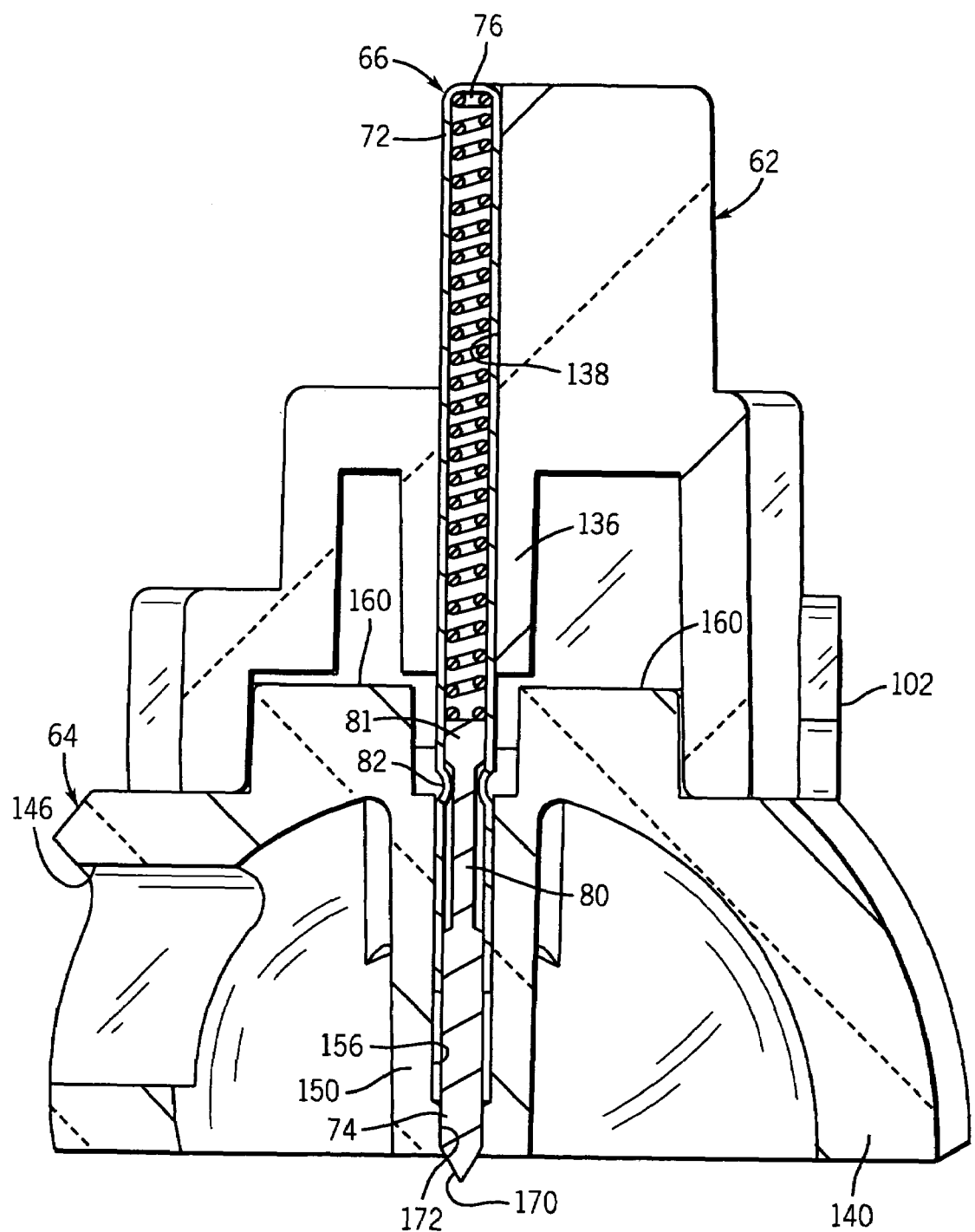
FIG. 23 is an enlarged, cross-sectional view of the probe tip similar to FIG. 8, but FIG. 23 shows a pin in cross section and disposed in the probe tip.

At the lower end of the housing 50 is a probe tip or nose assembly 60 comprising a transparent probe tip upper part 62, a transparent probe tip lower part 64 which is permanently attached to the upper part 62 (as with adhesive or other suitable means), and four conductive pins 66 which each comprises a barrel or sleeve 72, a plunger 74 which is telescopically received within the barrel 72, and a compression spring 76 which biases the plunger 74 outwardly. As can be seen in FIG. 23, the plunger 74 of each pin 66 has an intermediate, reduced diameter portion 80 below an upper end portion 81. The pin barrel 72 has a reduced diameter, interior bead 82 located around the reduced diameter portion 80 of plunger 74 below the plunger upper end 81 so as to prevent the plunger 74 from being removed from the pin barrel 72. The pin spring 76 biases the plunger 74 outwardly (downwardly as shown in FIG. 23). However, as explained in more detail hereinafter, the pin barrel bead 82 does not engage the pin plunger top upper end 81 because the bottom end of the pin plunger 74 engages the probe tip lower part 64 at a location that causes the top end of the plunger 74 to be spaced slightly above the pin barrel bead 82 (with the spring 76 being under a small amount of compression). In the illustrated preferred embodiment, the attached assembly of probe tip upper part 62 and attached probe tip lower part 64 may be characterized as an electrically insulating, pin captivation structure for holding the pins 66 in the desired orientation and configuration.

Each pin 66 functions as an electrically conductive engaging member which includes, among other things, two functional portions: (1) an outwardly projecting distal end (i.e., the pointed, lower end of the plunger 74) for contacting the copper coating, and (2) a proximal portion (i.e., upper part of the barrel 72) for engaging a contact 54 (FIG. 16). The presently preferred form of the particular pin 66 as illustrated in FIG. 23 (and in some of the other figures) is sold under the general model designation or trademark "Pogo" pin by Everett Charles Technologies, ECT Headquarters, 700 E. Harrison Avenue, Pomona, Calif. 91767, U.S.A.

Figure 2:
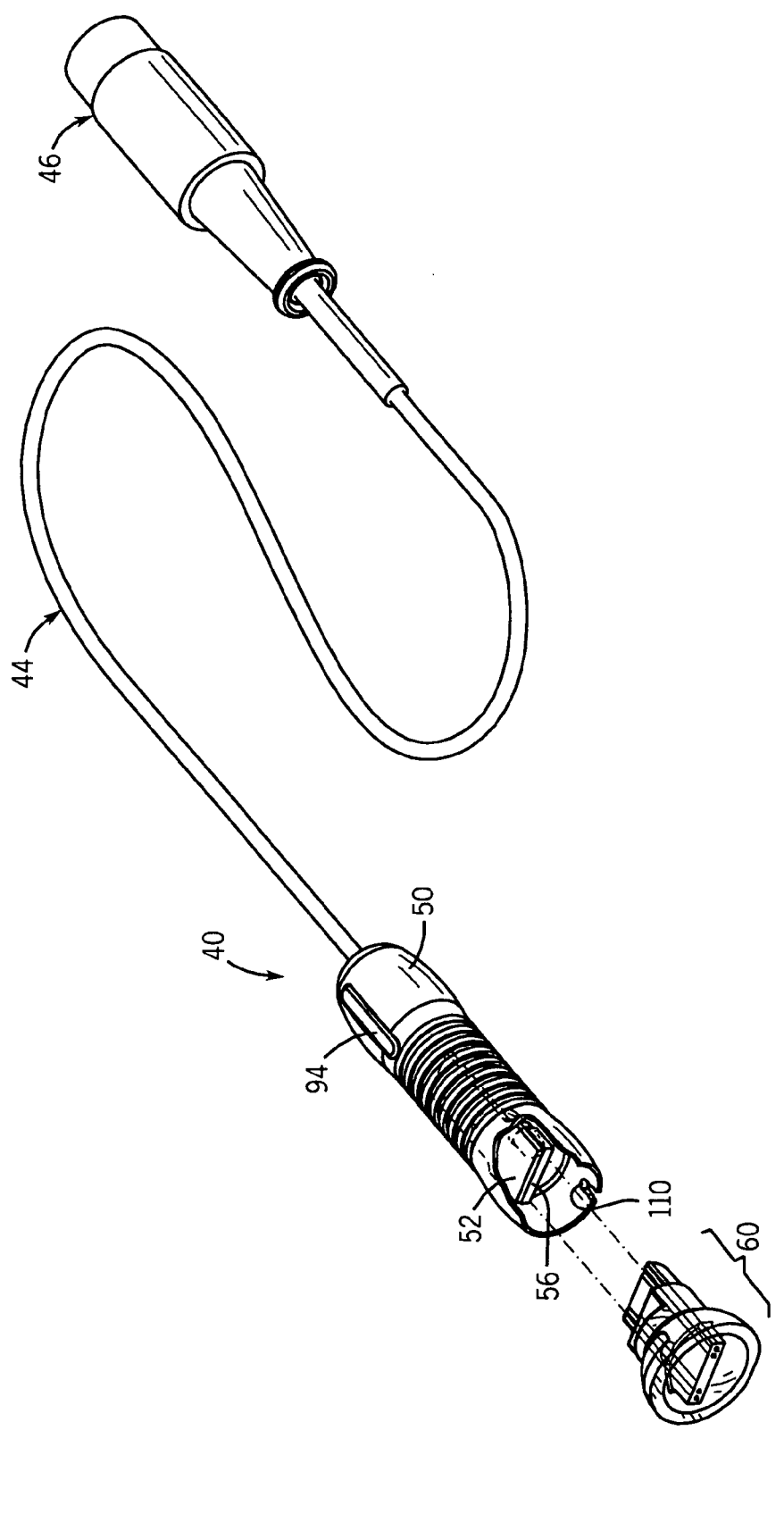
FIG. 2 is a view similar to FIG. 1, but FIG. 2 shows the removable, transparent tip of probe having been removed from the housing, and shows a portion of the housing broken away to illustrate a portion of the interior.
Figure 2A:
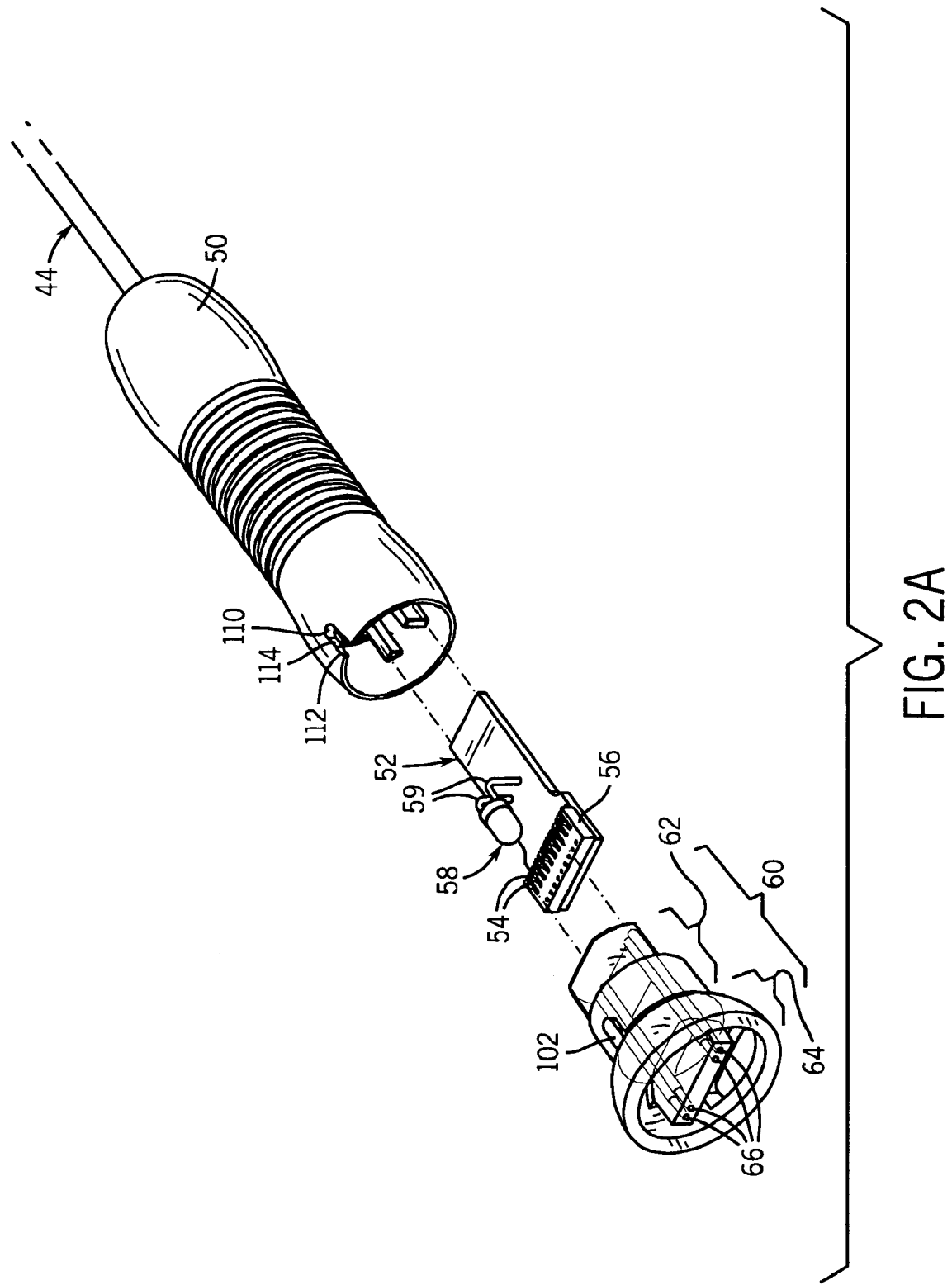
FIG. 2A is an isometric view similar to FIG. 2, but in FIG. 2A, the probe and components are viewed from the back of the probe (180 degrees from the view orientation in FIG. 2)
Figure 10:
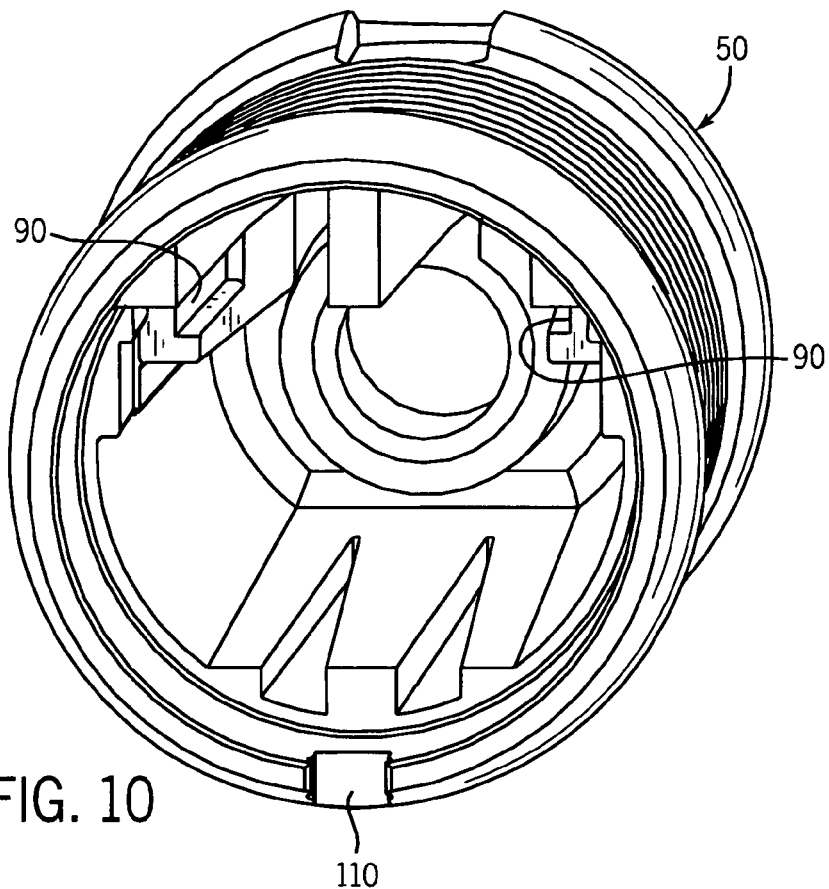
FIG. 10 is an isometric view of the probe housing from the access opening to show the interior of the receiving cavity prior to the installation of any components therein.
Figure 13:
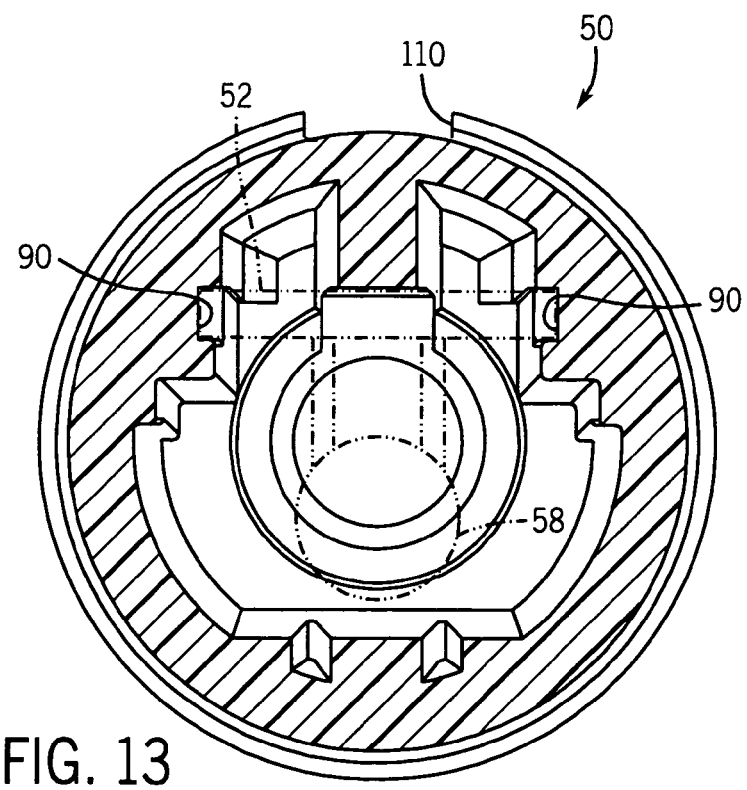
FIG. 13 is an enlarged, cross-sectional view taken generally along the plane 13—13 in FIG. 1, but FIG. 13 also shows installed internal components in phantom as represented by dot-dashed lines.
Figure 17:
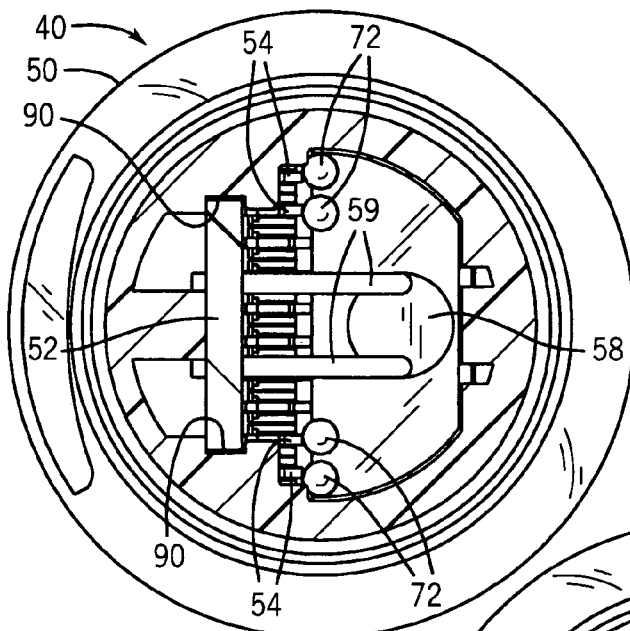
FIG. 17 is an enlarged, cross-sectional view taken generally along the plane 17—17 in FIG. 14.

FIG. 2A shows how the assembly of the printed circuit board 52, LED 58, and fixture 56 (with the contacts 54) is adapted to be mounted by the manufacturer in the cavity defined in the interior of the housing 50. For ease of installation, the cable 44 is typically initially inserted through hole 41 in the top end of the empty housing 50 and out of the open bottom end of the housing 50 so that the cable wiring can be soldered, or otherwise electrically connected, to the printed circuit board 52. Thereafter, the cable 44, along with the attached printed circuit board 52 and components thereon, are pulled into the interior of the housing 50. Opposite lateral edges of the printed circuit board 52 are each respectively received within a respective channel 90 in the housing 50 as can be seen in FIGS. 10 and 17, as well as in FIG. 13 (wherein the printed circuit board 52 is illustrated in phantom by dashed dot lines).

The integrated circuit on the printed circuit board 52 and the internal wiring within the housing 50 which connects the printed circuit board 52 with the extending portion of the cable 44 may be characterized as an electrical circuit adapted to provide electrical communication between one or more of the contacts 54 and the processing system (which may include the power supply) in the base unit (not illustrated).

The LED 58 may be any suitable conventional or special light-emitting diode. The LED 58 is connected with leads or wires 59 (FIG. 3) to the electronic circuit on the printed circuit board 52 for receiving power which is supplied to the printed circuit board 52 through the cable 44 from the base unit (not illustrated). As shown in FIG. 14, the LED leads 59 are relatively stiff so that they hold their shape to support the LED 58 in a fixed location projecting outwardly from the printed circuit board 52 and over the top (inner) end of the probe tip upper part 62. In a presently preferred embodiment, the LED 58 is a conventional, commercially available LED providing a generally white light. A presently preferred LED is the type of LED provided by Marktech Optoelectronics, 120 Broadway, Menands, N.Y., U.S.A., under model designation No. LC374NWH1-30H.

The housing 50 preferably also includes a label member 94 (FIG. 3) which may be adhesively secured or snap-fit into a receiving recess 96 in the exterior surface of the housing 50. The label member 94 may include indicia, such as a model designation, trademark, etc.

Figure 5:
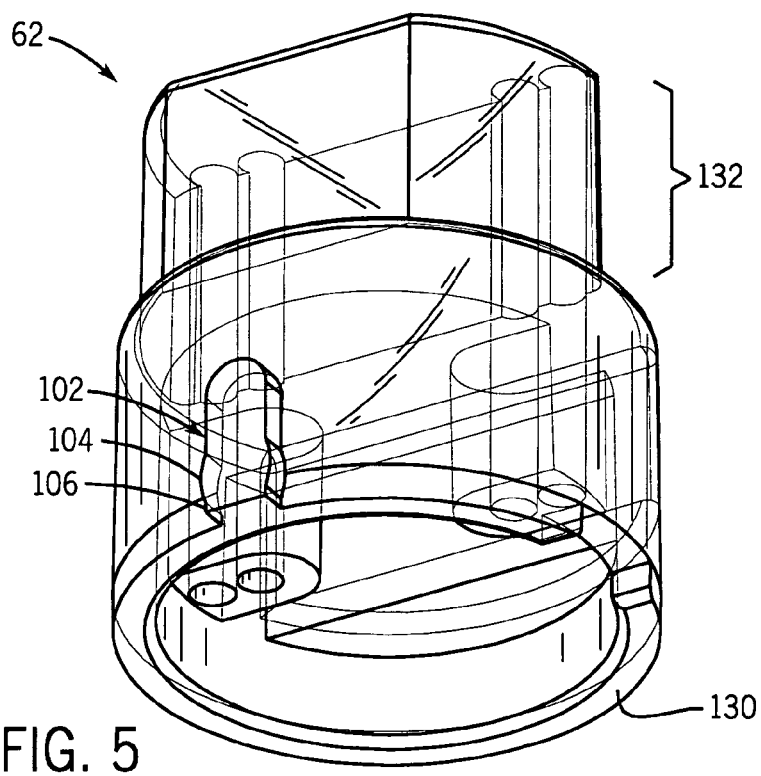
FIG. 5 is an isometric view of the probe tip upper part as viewed from the back to show a snap-fit tab.
Figure 6:
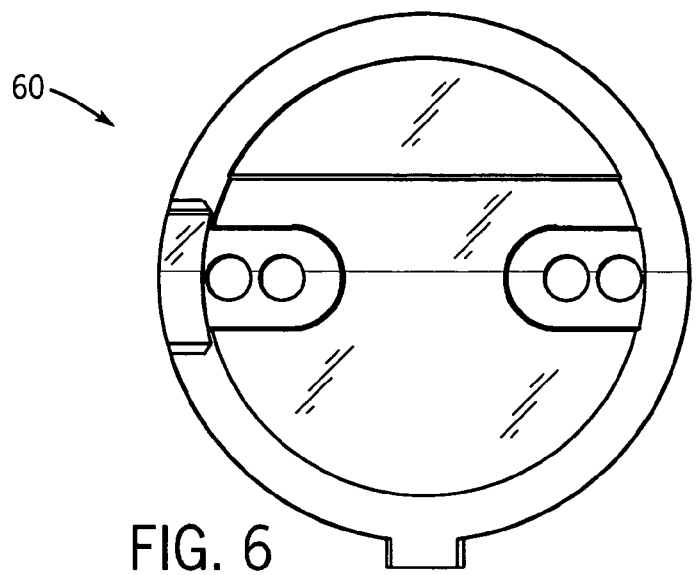
FIG. 6 is a bottom plan view of the probe tip upper part as shown in FIG. 4.

With reference to FIG. 2A, the nose assembly or probe tip 60 (which comprises the pins 66 contained within the assembled probe tip lower part 64 and probe tip upper part 62) is preferably adapted to be removably (releasably) mounted in the end of the housing 50. The probe tip 60 is preferably designed to cooperate in a snap-fit engagement with the housing 50. To this end, the probe tip upper part 62 includes a tab 102 (FIGS. 2A and 5). As shown in FIG. 5, the tab 102 has a slightly enlarged (wider) head 104 and a very short, reduced width neck 106. As shown in FIG. 2A, the housing 50 is a generally tubular structure having a peripheral wall that defines an internal receiving cavity with an access opening defined by the round opening at the bottom end of the housing 50. At the bottom end of the housing 50, the peripheral wall of the housing 50 defines a slot 110. At the very bottom edge of the housing 50, the slot 110 has a reduced width opening 112. Just slightly inwardly of the reduced width opening 112, the slot 110 has a slightly enlarged recess 114.

With reference to FIG. 2A, the tip 60 can be inserted into the open bottom end of the housing 50 so that the tip tab 102 is received in the housing slot 110. The slightly enlarged tab head 104 is defined by slightly arcuate or curved side surfaces which facilitate the elastic spreading or deformation of the housing 50 as the housing slot reduced width opening 112 temporarily widens to accommodate longitudinal movement of the tip tab enlarged head 104 through the opening 112 and into the adjacent, enlarged recess 114 of the housing slot 110. When the tip 60 is properly and fully seated within the end of the housing 50, the enlarged head 104 of the tip tab 102 is snugly received within the housing slot enlarged recess 114, and the reduced width neck 106 of the tip tab 102 is firmly and snugly received within the housing slot reduced width opening 112 to create a releasable snap-fit engagement.

The tip 60 can be readily removed by the user who merely needs to grasp the tip lower part 64 which projects from the bottom end of the housing 50 (FIG. 1), and then pull the tip 60 outwardly with sufficient force to overcome the snap-fit engagement. This allows the user to readily remove and replace a damaged probe tip 60. Also, this allows the user to readily change one type of probe tip for another type of probe tip. For example, as will be explained in more detail hereinafter, probe tips 60 may be provided in different configurations with different features that may be more suitable for a particular application. A different probe tip can be installed into the probe housing 50 very quickly. This capability improves the versatility of the probe 40.

As can be seen in FIGS. 15, 16, 17, 18, and 19, the pins 66 are disposed in the assembled probe tip upper part 62 and lower part 64 so that the pin proximal portion or barrel 72 engages an adjacent contact 54. Each contact 54 has a spring arm 120 for being engaged by the adjacent pin barrel 72. The spring arm 120 of each contact 54 is adapted to be elastically deflected inwardly when engaged with the adjacent pin barrel 72 so as to insure good electrical contact. The engagement between each pin barrel 72 in the adjacent contact 54 allows the pin 66 to be pulled outwardly with the rest of the probe tip assembly (the probe tip upper part 62 and probe tip part 64) by the user when the user wishes to remove the probe tip.

Figure 18:
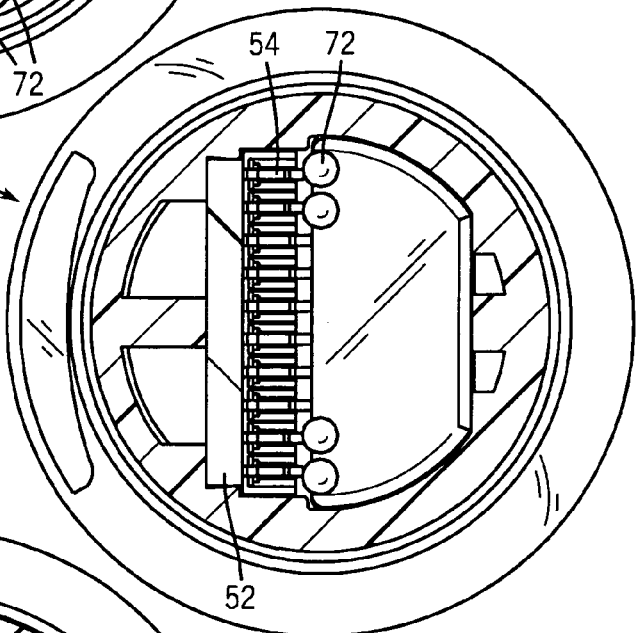
FIG. 18 is an enlarged, cross-sectional view taken generally along the two planes 18—18 in FIG. 14.
Figure 19:
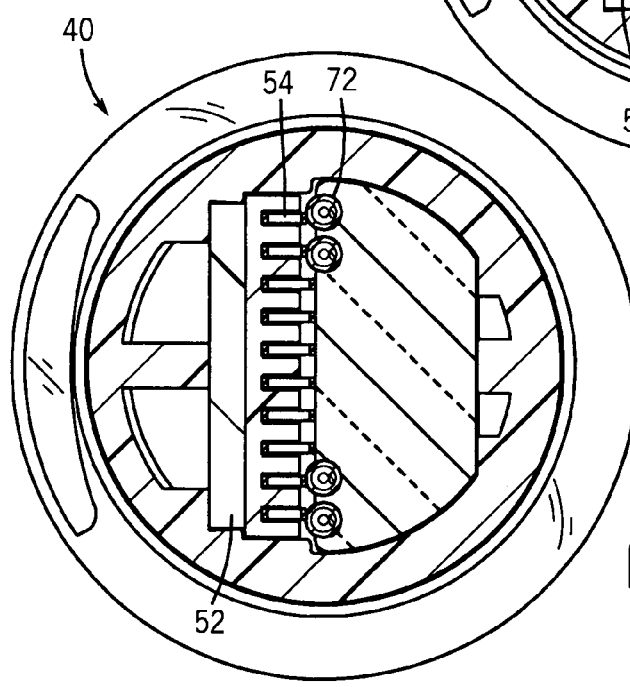
FIG. 19 is an enlarged, cross-sectional view taken generally along the plane 19—19 in FIG. 14.

For manufacturing convenience, the probe incorporates the above-described commercially available connector 53 that has ten contacts 54. Only four of the contacts 54 are employed in the presently preferred embodiment of the probe illustrated, and each of those four contacts 54 respectively engages an adjacent respective one of the four pin barrels 72 as can be seen in FIGS. 17–19. The engagement of each pin barrel 72 with an arm of an adjacent pin 54 provides good electrical contact while permitting easy removal of the probe tip containing the pins 66 without requiring the use of a tool or tools.

The design of the nose assembly or tip 60 provides a very good system for mounting each pin 66 in a proper orientation and for holding the pin 66 tightly in position while minimizing lateral movement or wobble of the distal end of the pin that contacts the copper coating. This design is achieved with the use of the pin captivation structure the is defined by the structure of the probe tip upper part 62 and probe tip lower part 64 as will next be explained in detail.

Figure 7:
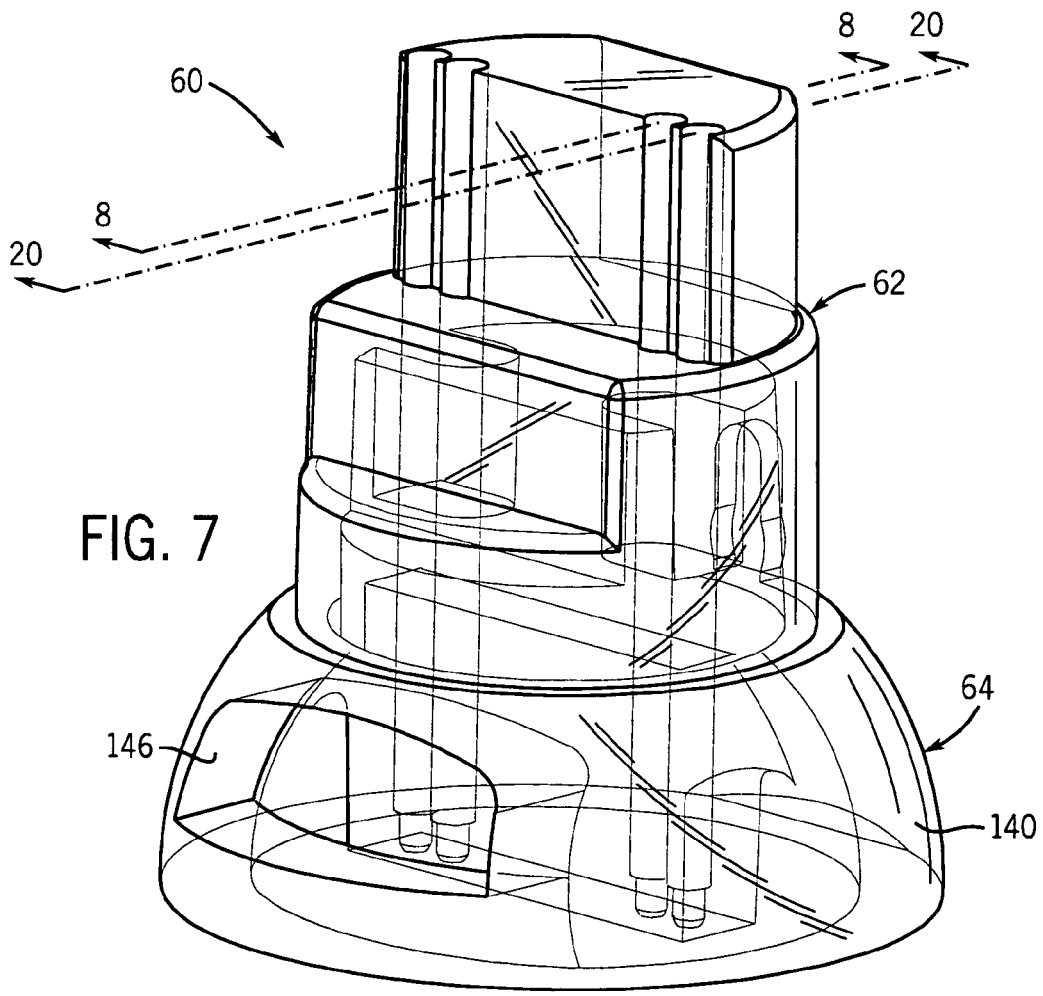
FIG. 7 is a front, isometric view of the probe tip showing the probe tip upper part attached to the probe tip lower part prior to installation of the four pins.
Figure 8:
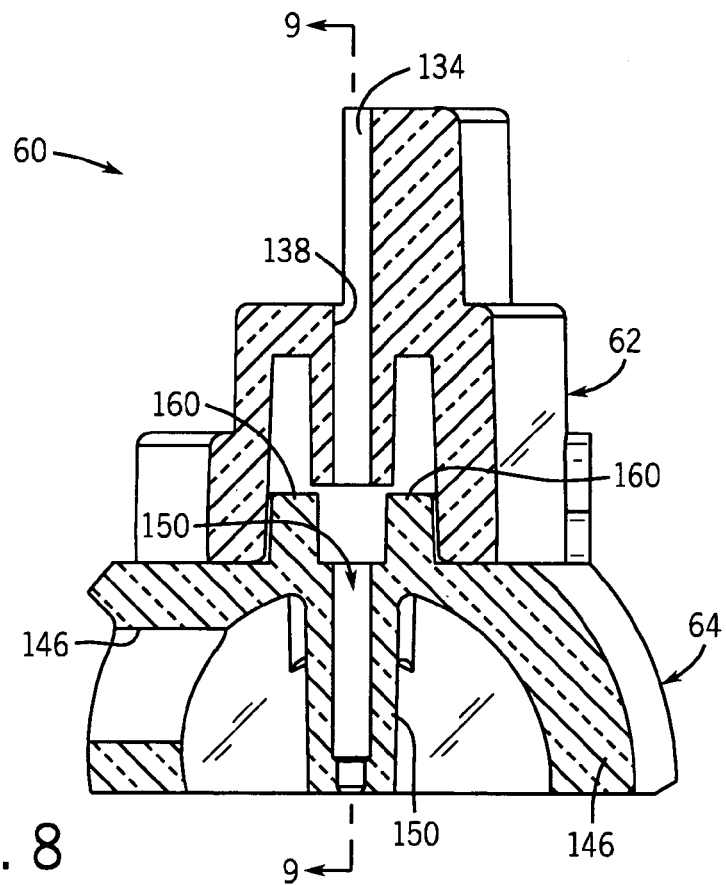
FIG. 8 is a cross-sectional view taken generally along the plane 8—8 in FIG. 7 where the plane 8—8 is cut through the vertical hole closest to the right side of FIG. 7.
Figure 9:
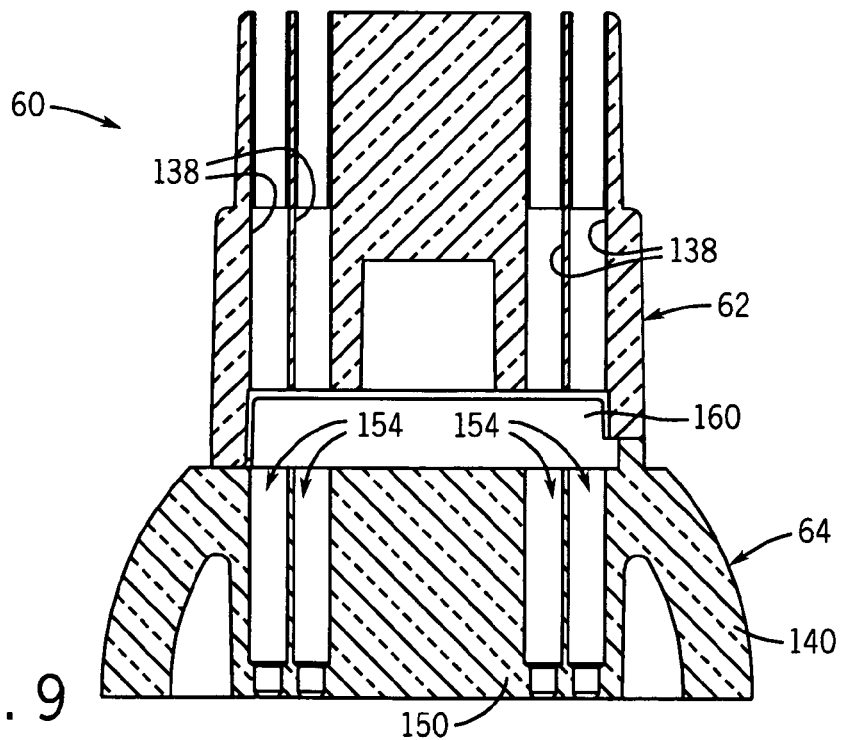
FIG. 9 is a cross-sectional view taken generally along the plane 9—9 in FIG. 8.
Figure 22:
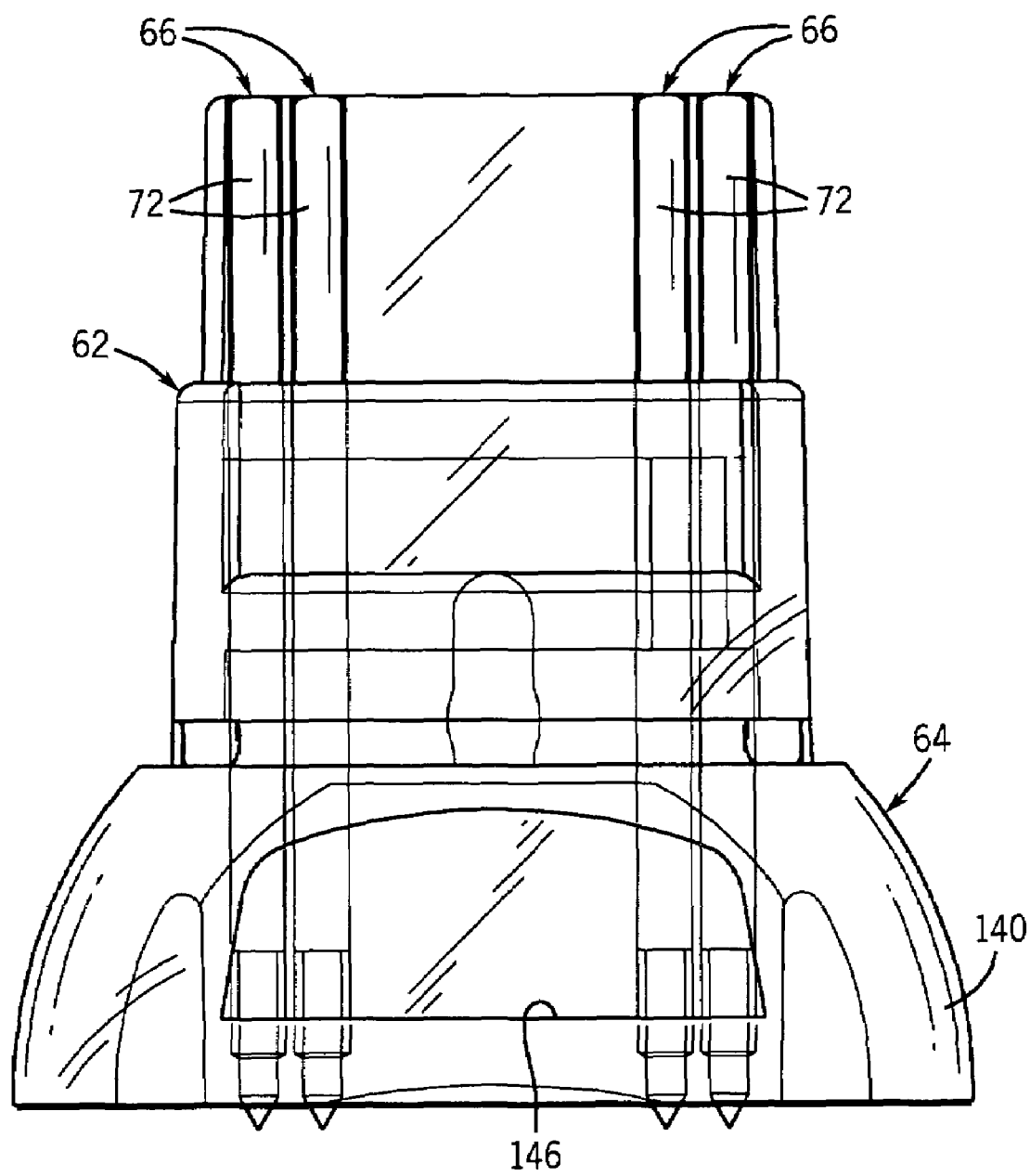
FIG. 22 is a front, elevational view of the probe tip as shown in FIG. 7, but FIG. 22 also shows the pins as installed in the probe tip.

The probe tip upper part 62 and the probe lower part 64 (FIG. 3) are each preferably individually molded from an electrically insulating material to facilitate manufacturing, and then the two molded parts are adhesively, or otherwise, secured together to form a pin captivation structure (as shown in FIGS. 7, 8, and 9) for receiving and captivating each of the four pins 66 as shown in FIGS. 22 and 23. In the presently preferred embodiment, the tip upper part 62 and the tip lower part 64 are each molded from a transparent, electrically insulating, non-conductive thermoplastic material, such as transparent polycarbonate. A suitable transparent form of the material is sold in the United States of America under the trade name or trademark LEXAN by General Electric Company which has a place of business at 3135 Easton Turnpike, Fairfield, Conn. 06828-0001, U.S.A. Other suitable materials may be employed instead.

Figure 4:
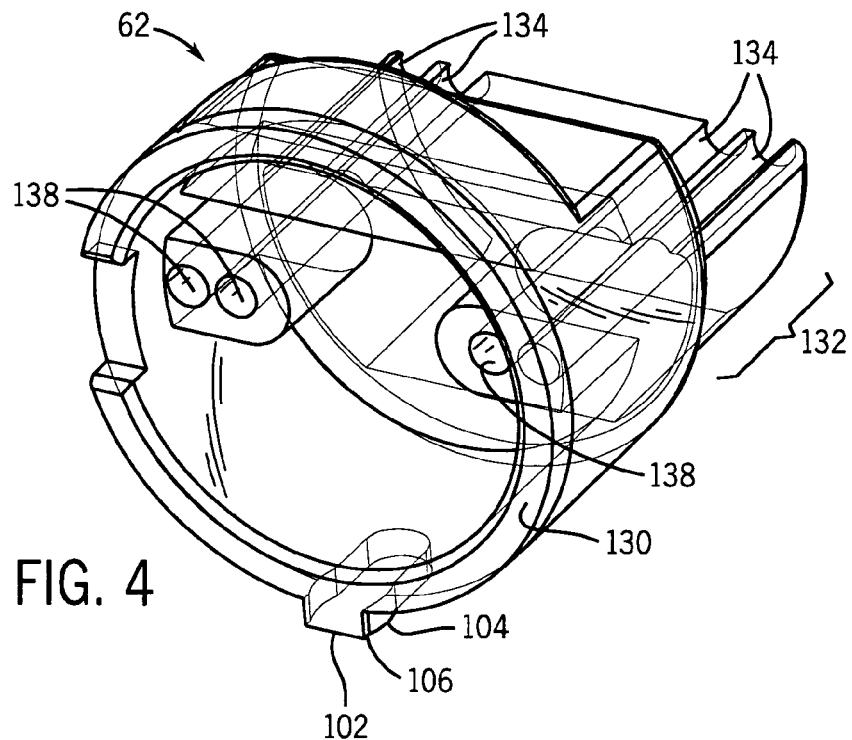
FIG. 4 is an isometric view of the bottom of the probe tip upper part prior to the probe tip upper part being attached to the probe tip lower part (as shown in FIG. 7) and prior to installation of the pins.
Figure 15:
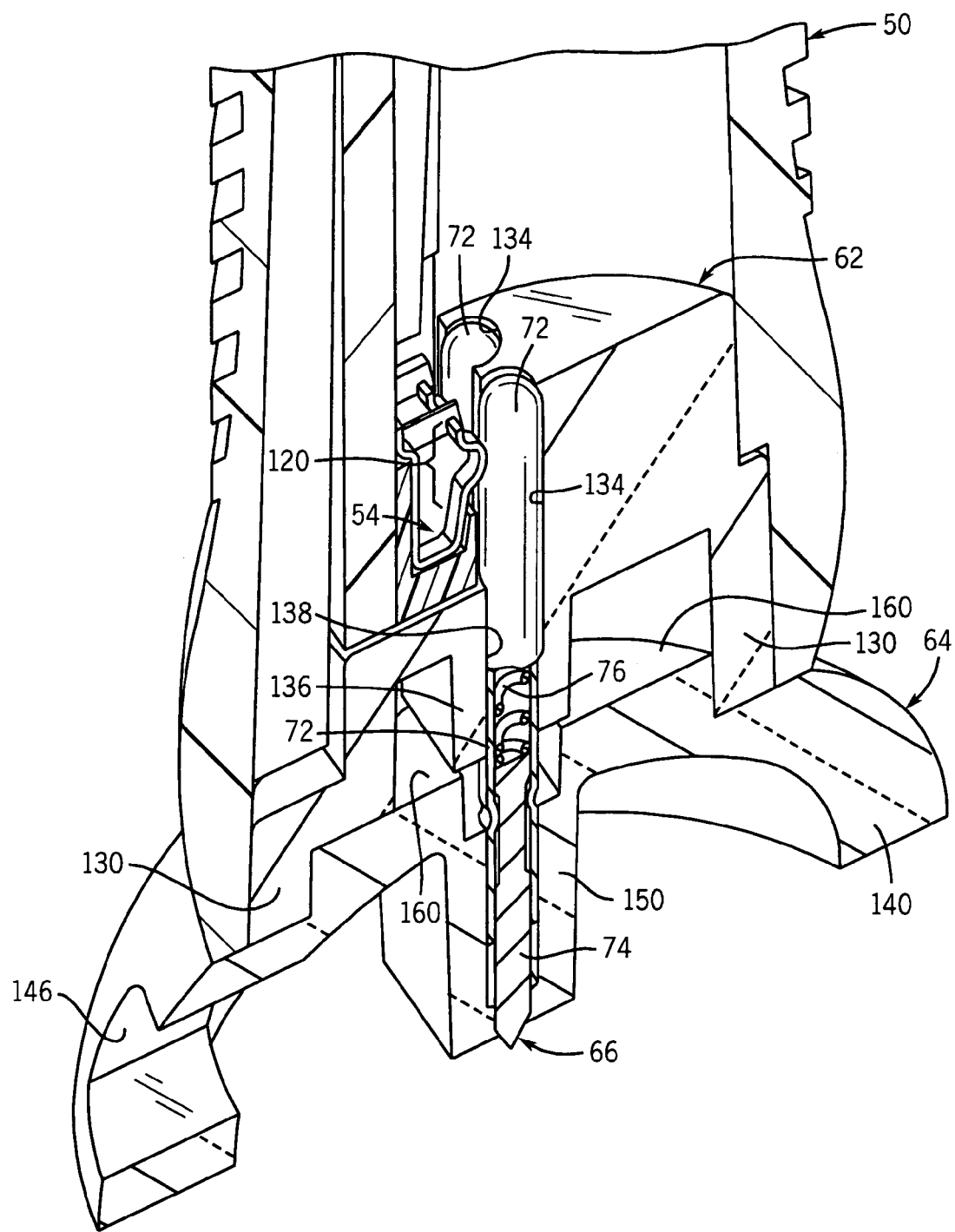
FIG. 15 (on the drawing sheet after the sheet containing FIGS. 14 and 16) is a fragmentary, isometric view of the portion of the probe shown in FIG. 16.

As can be seen in FIGS. 4 and 5, the probe tip upper part 62 has a generally annular lower portion 130 defining an internal cavity or recess for receiving upwardly projecting portions of the probe tip lower part 64 (see FIGS. 8 and 9). With reference to FIGS. 4 and 5, the probe tip upper part 62 includes an upper, pin-stabilizing portion 132 which has four, semi-cylindrical cavities or recesses 134 (FIG. 4) for each receiving a portion of the pin barrel 72 as shown in FIG. 15. This allows an oppositely facing, semi-cylindrical side surface of each barrel 72 to be exposed for contacting an arm 120 of an adjacent contact 54 to establish good electrical contact, and this permits removal of the probe tip 60 by longitudinal withdrawal of the probe tip 60 from the probe housing 50.

As can be seen in FIGS. 15 and 23, an intermediate portion or length of each pin barrel 72 is entirely surrounded by a central portion 136 which projects downwardly in the probe tip upper part 62 to provide a secure captivation of the pin barrel 72. This captivation of an intermediate portion of each pin barrel 72 is accomplished by press-fitting the pin barrel 72 into a hole or bore 138 (FIGS. 4, 15, and 23) that extends through the probe tip upper part 62. The hole 138 is aligned with, and forms a continuation of, the semi-cylindrical cavity 134 in the upper portion of the probe tip upper part 62 (FIGS. 4 and 15). In the preferred embodiment illustrated, the components are preferably dimensioned so that the barrels of the pins 66 each can be press-fit into the probe tip upper part 62 until the top of each pin barrel 72 is generally flush with the top end surface of the probe tip upper part 62 (FIGS. 15 and 23). The preferred dimensional relationship between the outside diameter of each pin barrel 72 and the internal diameter of its respective receiving bore 138 in the probe tip upper part 62 is described in detail hereinafter. In the presently preferred embodiment, the probe tip upper part 62 is molded with the bores 138 and cavities 134. However, the bores 138 could be drilled instead.

The probe tip lower part 64 has a flared configuration owing to an outer shroud 140 defined by a partially spherical outer surface and a partially spherical inner surface. The shroud 140 functions as a peripheral platform that projects from the probe housing 50 (as shown in FIG. 1) when the probe tip is properly installed in the probe housing 50. The shroud or peripheral platform 140 extends laterally around at least a portion of the lengths of the projecting plungers 74 of the pins 66 (FIG. 15) to provide support for the probe 40 when each pin plunger 74 is engaged with the copper coating and forced against the pin spring 76 further into the pin barrel 72.

Figure 24:
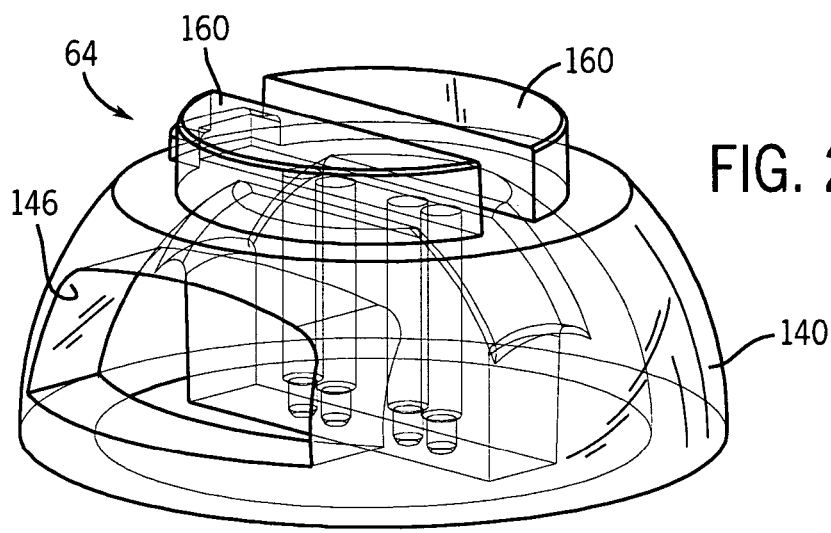
FIG. 24 is an isometric view of the probe tip lower part as viewed from the front.

As can be seen in FIGS. 1 and 24, the shroud or peripheral platform 140 defines an open, viewing aperture 146 to accommodate visual inspection of the pin plungers 74 on the copper coating when the probe 40 is supported by the peripheral platform 140 over the copper coating.

As can be seen in FIGS. 8 and 9, the probe tip lower portion 64 includes an internal, downwardly projecting wall 150 which extends, in the preferred embodiment illustrated, to the bottom of the shroud or peripheral platform 140. The wall 150 defines four, multi-diameter bores or passages 154 as can be seen in FIG. 9. The passages 154 are each adapted to receive a lower portion of a pin 66 which is disposed to project through the bottom of the wall 150 as shown in FIG. 15.

As illustrated in FIG. 24, the top of the probe tip lower part 64 includes two spaced-apart, partially cylindrical bosses 160, and the bosses 160 are adapted for each being received within the cavity defined inside the lower peripheral wall 130 of the probe tip upper part 62 as illustrated in FIGS. 15 and 16. The exterior, partially cylindrical surfaces of the bosses 160 mate with the interior cylindrical surface of the probe tip upper part lower peripheral wall 130. The upper part 62 and lower part 64 are adhesively secured together along those mating surfaces. Alternatively, other designs could be employed to facilitate attachment of the probe tip upper part 62 to the probe tip lower part 64.

Further, in an alternate embodiment (not illustrated) the probe tip upper part 62 and the probe tip lower part 64 could be connected together with suitable mechanical expedients, including the use of mechanical fasteners, staking, ultrasonic welding, etc. In yet another contemplated, alternate embodiment (not illustrated), the pin captivation structure need not be assembled from two separate pieces (such as probe tip upper part 62 and probe tip lower part 64), and instead, a suitable pin captivation structure could be initially molded as a single, unitary structure (without any internal cavities so as to facilitate ease of molding of such a unitary structure). In yet another contemplated, alternate embodiment (not illustrated), the pin captivation structure could be assembled from three or more separate pieces.

Figure 20:
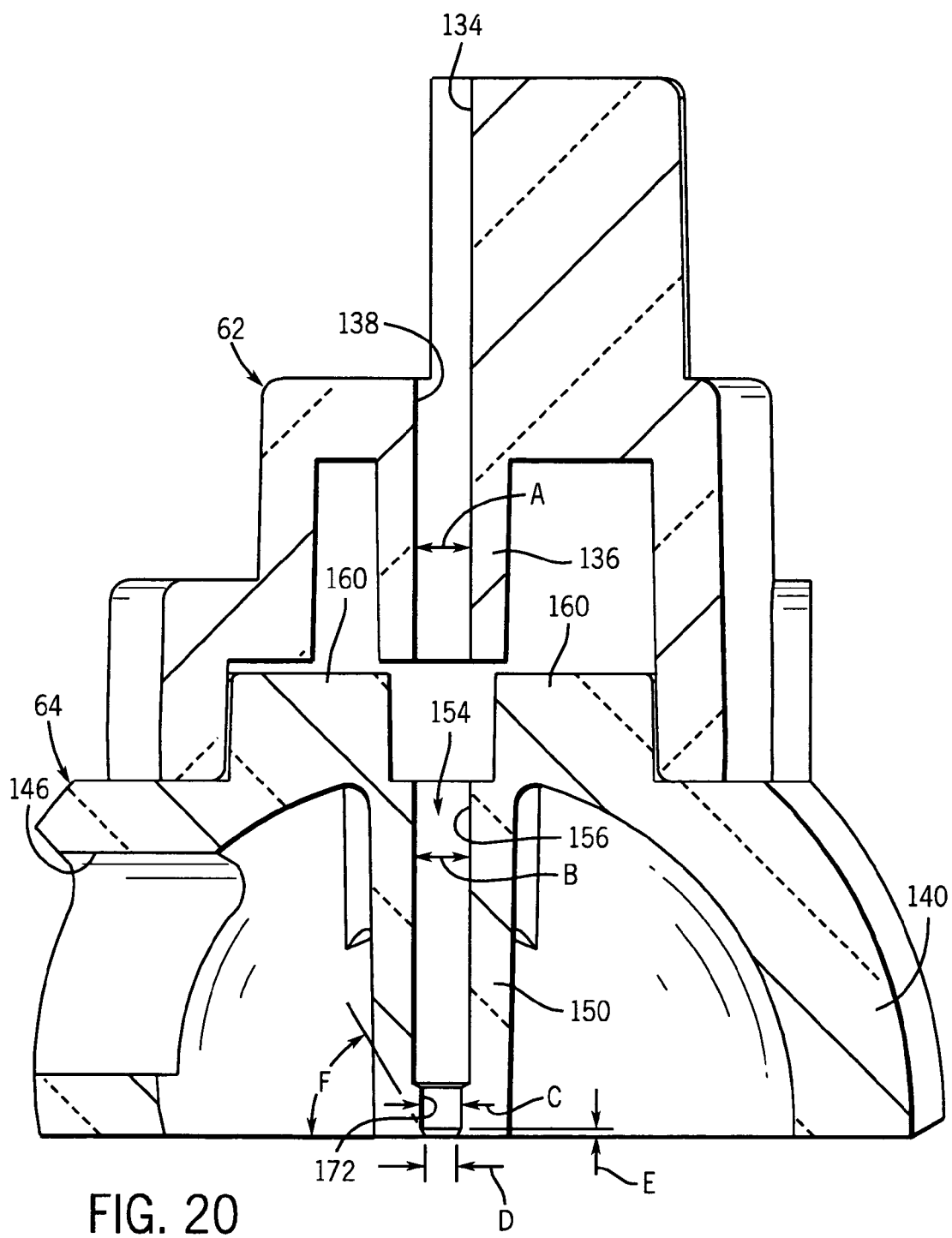
FIG. 20 is a greatly enlarged, cross-sectional view taken generally along the plane 20—20 in FIG. 7 wherein the plane 20—20 is cut through the vertical hole that is the second hole from the right side of FIG. 7.
Figure 21:
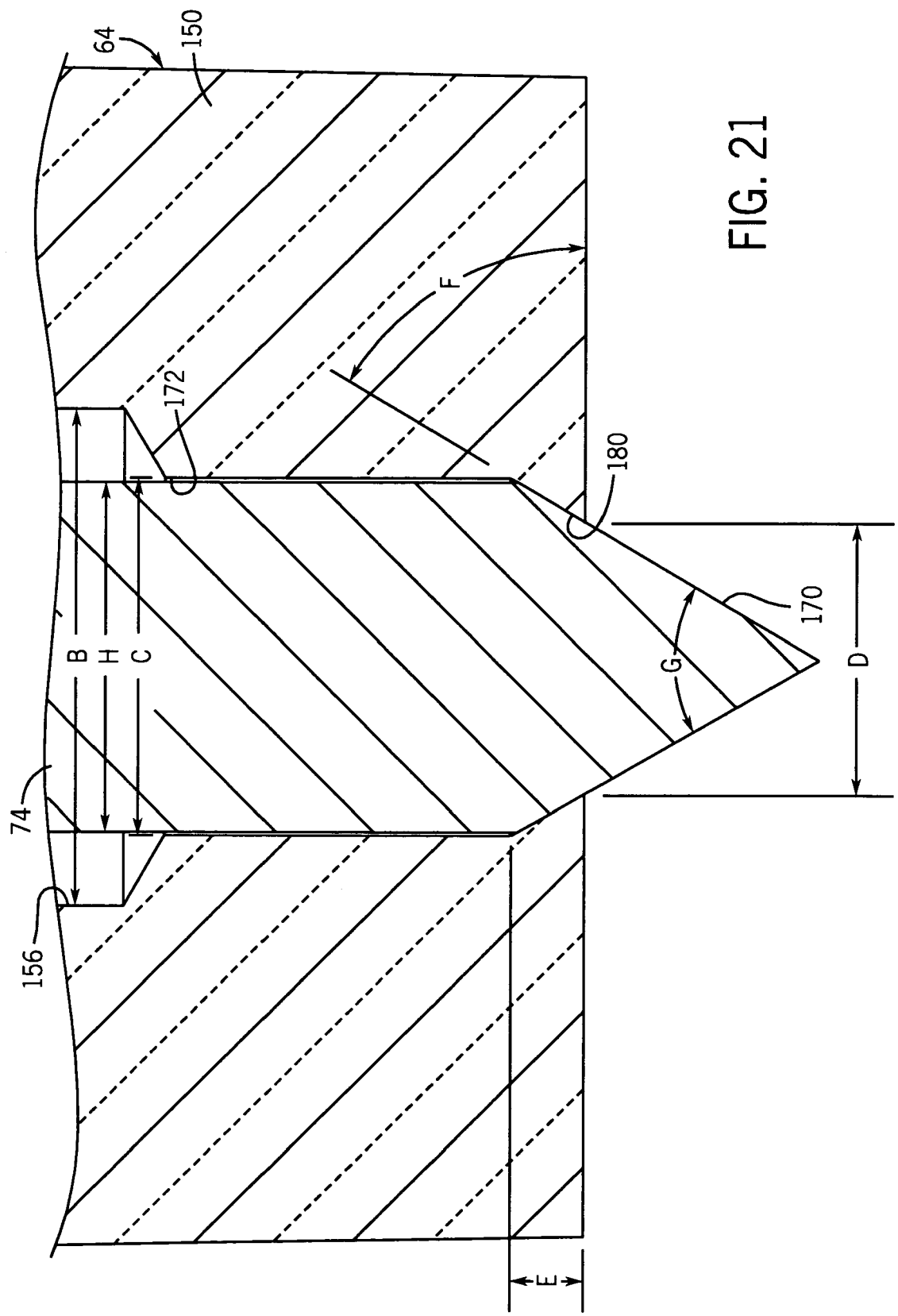
FIG. 21 is a greatly enlarged, fragmentary cross section of the circular region identified by the curved line 21—21 in FIG. 16.

Further details of the preferred design for captivating each of the pins 66 in the probe tip captivation structure (comprising the probe tip upper part 62 and probe tip lower part 64) will next be explained in detail with reference to FIGS. 20, 21, and 23. Each probe tip upper part bore 138 and probe tip lower part passage 154 are adapted to receive a pin 66 as shown in FIG. 23. In the particular illustrated embodiment, the barrel 72 of each pin 66 has an outside diameter of 0.0420 inch. The probe tip upper part bore 138 has a smaller diameter A (FIG. 20) of 0.0415 inch. This results in a radial interference of 0.00025 inch (0.0420 inch minus 0.415 inch, divided by 2) which must be accommodated by local deformation of the probe tip upper part 62 during a press-fit installation of the pin barrel 72 into the bore 138. In the probe tip lower part 64, the top end of the passage 154 is defined by an upper bore 156 having a diameter B (FIG. 20) of 0.043 inch. Each pin 66 is installed by press-fitting the pin barrel 72 into the slightly smaller diameter A of the probe tip upper part bore 138, but there is a radial clearance around the lower portion of the pin barrel 72 in the upper bore 156 of the probe tip lower part 64, and that radial clearance is 0.0005 inch (0.0430 inch minus 0.0420 inch, divided by 2).

Each pin plunger 74 (FIG. 23) may be characterized as a shank having a distal end conical point or tip 170. In the preferred embodiment, the plunger shank has an outside diameter H (FIG. 21) of 0.030 inch above the tip 170. Thus, each pin plunger 74 has a clearance in the upper bore 156 of the passage 154 of the probe tip lower part 64 because the diameter B of the upper bore 156 is 0.043 inch which is larger than the pin plunger diameter H of 0.030 inch.

The bottom portion of each passage 154 in the probe tip lower part 64 is defined by a lower bore 172 (FIGS. 20, 21, and 23) having a diameter C of 0.031 inch. Each lower bore 172 is adapted to receive a plunger 74 of a pin 66. Thus, around the shank of the pin plunger 74 in the lower bore 172 (FIG. 21), there is a very small radial clearance of 0.0005 inch (0.031 inch bore diameter minus 0.030 inch plunger diameter, divided by 2).

The radial clearance around the pin plunger 74 in the upper bore 156 and the small amount of radial clearance around the lower end of the pin plunger 74 in the lower bore 172 are provided to accommodate a relative vertical displacement between the plunger 74 and the probe tip lower part 64. The inventors have determined that precision and accuracy of the copper thickness measurement can be deleteriously affected by lateral displacement of the pin point 170 which could occur in conventional prior art probe systems prior to, and during, engagement of the pin point with the copper coating. In order to minimize, if not substantially eliminate, significant lateral pin movement which could cause an unwanted decrease in precision and/or accuracy of the measurement, one aspect of the present invention provides a pin plunger restraining structure that includes only a very small clearance in the bore 172 around the shank of the plunger 74 so as to limit lateral displacement or wobble, and that also includes a special frustoconical seat 180 (FIG. 21) for engaging the conical, distal end point 170 of the pin plunger 74 (at the bottom end of the lower bore 172), to provide an initial, lateral restraint of the tip 170. In the particular preferred embodiment illustrated in FIG. 21, the pin point 170 has a cone angle or conical angle G (FIG. 21) of 60 degrees, and the frustoconical seat 180 of the probe tip lower part plunger restraining structure has a mating angle F (FIG. 21) of 60 degrees. As shown in FIG. 21, the probe tip lower part frustoconical seat 180 has a minimum opening diameter D (FIG. 21) at the bottom of the probe tip lower part wall 150. In the presently preferred embodiment, the opening diameter D is equal to 0.023 inch, and the frustoconical seat 180 has a height E (FIG. 21) of 0.0007 inch.

In the preferred embodiment illustrated, the end of the plunger tip 170 may project between about 0.015 inch and about 0.020 inch downwardly beyond the bottom of the seat 180. However, this is not a particularly critical dimension, and the plunger tip 170 may be designed to project a lesser or greater amount in some applications. This could be accomplished by changing, for example, the tip conical angle G.

Depending upon component sizes and materials, the above-discussed preferred diameter dimensions of the components and the receiving bores may be varied so long as a portion of the pin barrel 72 is securely captivated and so long as the pin plunger tip 170 is initially laterally restrained at a predetermined location at the bottom of the probe (as by engagement of the pin tip 170 with the seat 180).

In the preferred embodiment illustrated, the conical distal end or point 170 is symmetric about the longitudinal axis of the shank of the pin plunger 74, and the plunger restraining structure frustoconical seat 180 is defined about an axis that is coincident with the longitudinal axis of the plunger shank and conical distal end point 170. Preferably, the seat angle F and the plunger tip angle G are equal.

In the preferred embodiment, the plunger tip 170 becomes seated against the plunger restraining structure frustoconical seat 180 such that the plunger upper end 81 is spaced slightly above the pin barrel bead 82 (as can be seen in FIG. 23), and such that the pin spring 76 is under some slight compression.

This insures that the distal end point tip 170 of the pin will be properly seated against the frustoconical seat 180 whenever the probe pin point 170 is not in contact with the copper coating (or any other object, for that matter). This is important so as to insure that, as the pin point 170 is brought into contact with the copper coating, the pin point 170 will be stabilized and will always be in the same location at the bottom of the probe until contact is made between the pin point 170 and copper coating.

After contact is made between the pin point 170 and the copper coating, the probe captivation structure wall 150 and frustoconical seat 180 are free to continue moving downwardly toward the copper coating relative to the probe plunger 74 because the small amount of clearance around the plunger 74 within the lower bore 172 readily accommodates such relative movement (as the pin spring 76 compresses slightly further) without permitting significant lateral displacement or wobble. Because the engagement of the frustoconical seating surface 180 with the point 170 of the pin plunger 74 initially provides a predetermined location of the pin point 170 in the probe, each of the four pin points 170 will have a fixed location relative to the other pin points at the bottom of the probe just prior to the pin points 170 contacting the copper coating. This substantially eliminates any significant deviations in pin plunger point position that might otherwise be caused by misalignment of the pin plunger 74 in the pin barrel 72 or by pin wobble or deflection that could be encountered with some prior art devices.

The probe tip upper part bore 138, probe tip lower part upper bore 156, probe tip lower part bore 172, and probe tip lower part frustoconical seating surface 180 together may be characterized as defining a hole or passage for receiving the pin 66 and for accommodating some relative vertical displacement between the pin plunger 74 and the rest of the pin (and probe) while at the same time providing an effective stabilizing structure for restraining a portion of the pin barrel 74 against axial and lateral movement, and while at the same time providing a restraining structure around the plunger conical distal end tip 170 that minimizes, or substantially eliminates, lateral displacement of the plunger tip 170 prior to the tip 170 contacting the copper coating.

Because the tip 170 of each pin plunger is initially located at the same position in the probe relative to the other pin plunger tips, multiple probe placements on a copper coating for making multiple measurements of that copper coating will have a relatively high precision (i.e., the probe has a relatively good capability for repeatedly measuring the same copper coating to determine a thickness that falls within a predetermined minimum range).

Depending on the configuration of the coating or other material for which the probe is being used to measure the thickness, it may be desirable to have a smaller probe or a larger probe. For example, in some applications, the region or regions of a coating to be measured are very small and/or lie between holes or other features in a printed circuit board that prevents the use of larger probes. On the other hand, if a larger probe can be used, it is typically advantageous to use such a larger probe (one wherein the pins are further apart) because such a larger probe can have better accuracy compared to a smaller probe (one wherein the pins are closer together). In general, the widest pin spread in a probe yields the best accuracy and precision. Therefore, it can be desirable to have a probe design which optionally can accommodate different types of pin configurations. Because the probe tip 60 (FIG. 2) can be readily removed by the user without a tool or tools, a variety of different types probe tips 60 can be provided to the user for installation in the probe 40. Such other configurations of the probe tip 60 could have a variety of different pin spacings or could have the same pin spacings.

It may also be desirable to replace a "worn out" probe tip with an identical, new probe tip. In some measurement applications, the probe tip pins can be quickly worn down because the printed circuit boards are slid out of the measurement station before the probe tip has been lifted completely off of the copper coating. The removable probe tip feature of the present invention accommodates easy and rapid probe tip replacement in such situations without requiring re-calibration.

Figure 25:
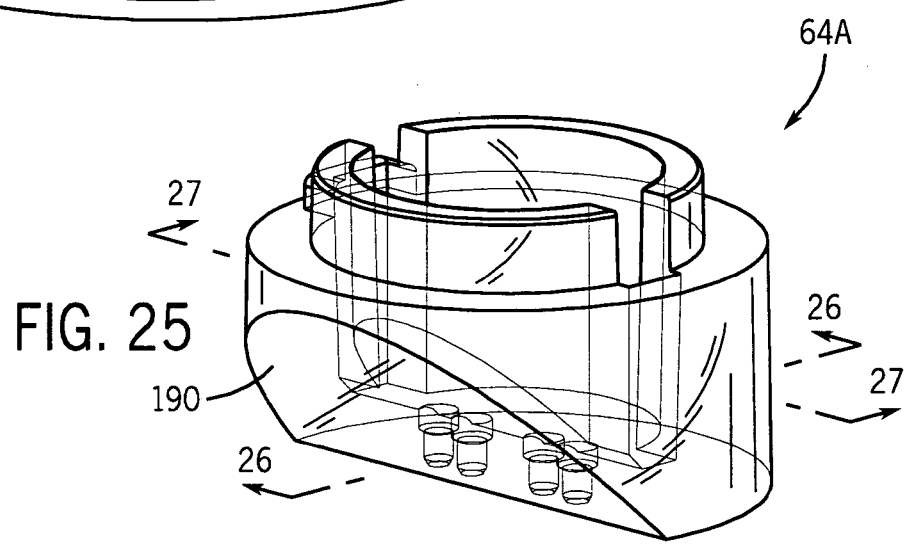
FIG. 25 is an isometric view of a first alternate embodiment of the probe tip lower part.
Figure 26:
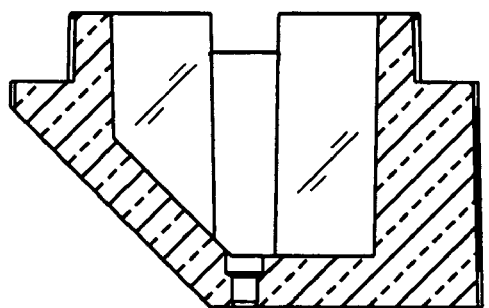
FIG. 26 is a cross-sectional view taken generally along the plane 26—26 in FIG. 25.
Figure 27:
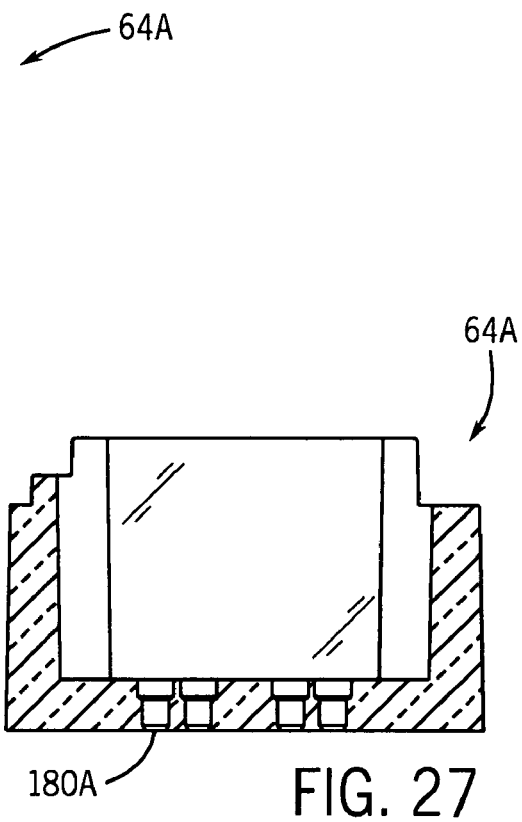
FIG. 27 is a cross-sectional view taken generally along the plane 27—27 in FIG. 25.

According to another aspect of the present invention, the probe 40 will accommodate changes of the probe tip 60 wherein only the configuration of the probe tip lower part 64 is substantially different. FIGS. 25–30 illustrate other designs of a probe tip lower part which are each adapted to be fixedly secured to the same probe tip upper part 62 that has been previously described with reference to FIGS. 1–24. FIG. 25 illustrates a first alternate embodiment of a probe tip lower part 64A. That alternate embodiment of the probe tip lower part 64A does not have a flared shroud or peripheral platform 140 like the first probe tip lower part 64 illustrated in FIG. 24. Rather, the probe tip lower part 64A has a partially cylindrical shape which is beveled on one side at surface 190 as shown in FIGS. 25 and 26.

Figure 28:
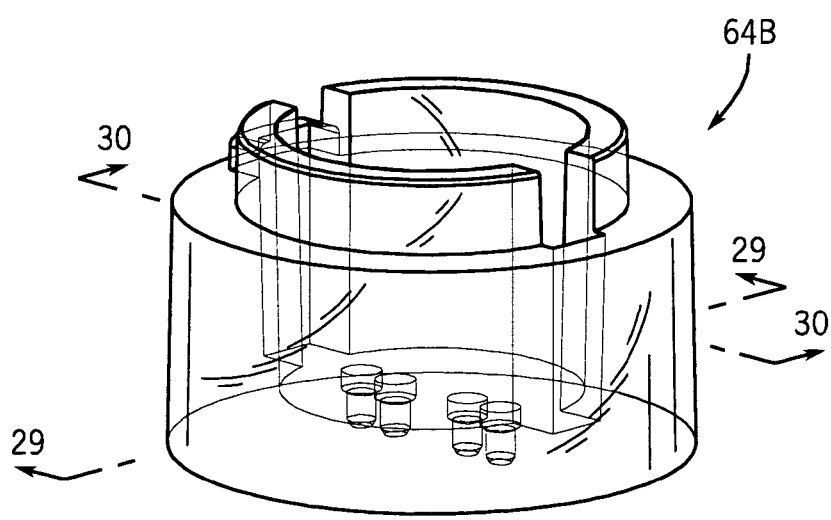
FIG. 28 is an isometric view of a second alternate embodiment of the probe tip lower part.
Figure 29:
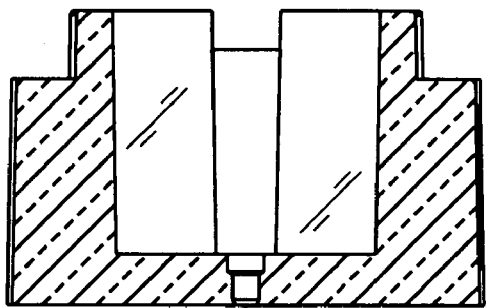
FIG. 29 is a cross-sectional view taken generally along the plane 29—29 in FIG. 28.
Figure 30:
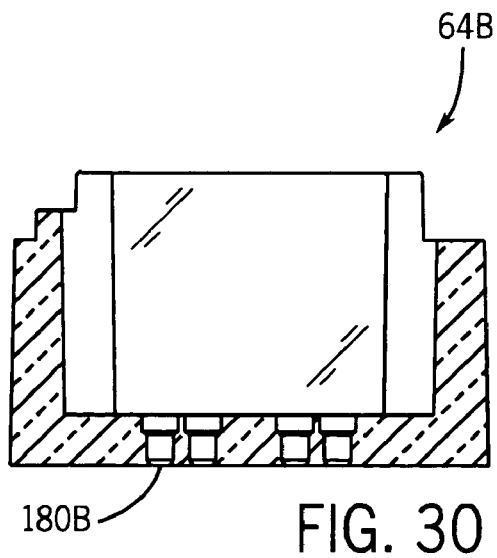
FIG. 30 is cross-sectional view taken generally along the plane 30—30 in FIG. 28.

A second embodiment of the probe tip lower part 64B illustrated in FIGS. 28–30 has a generally cylindrical configuration without any beveled surface.

Each of the alternate embodiments 64A and 64B of the probe tip lower part may be employed with a probe tip upper part that is substantially identical with the probe tip upper part 62 described above with reference to FIGS. 1–23. Each of the alternate embodiments of the probe tip lower parts 64A and 64B preferably includes a pin captivation feature in the form of a frustoconical seating surface 180A (FIGS. 26 and 27 for the first alternate embodiment) and 180B (FIGS. 29 and 30 for the second alternate embodiment). The frustoconical seating surfaces 180A and 180B are designed to cooperate with a pin conical tip (such as the first embodiment conical tip 170 illustrated in FIG. 21) in the same manner as has been described above with respect to the first embodiment of the probe.

In the illustrated embodiments, the probe tips are adapted to captivate the pins in a spaced-apart, planar array with the conical pin tips spaced along a straight line. However, in some applications, it may be desirable to have a non-linear arrangement of the pin conical tips. The present invention can accommodate probe pin captivation designs for a variety of pin arrangement configurations.

The probe tip upper part 62 and all of the probe tip lower part embodiments 64, 64A, and 64B are preferably molded from a transparent thermoplastic material, such as a transparent polycarbonate, to facilitate viewing of the lower ends of the pins and to transmit light from the LED (e.g., LED 58 described above with reference to the first embodiment of the probe illustrated in FIGS. 1–24). It will be appreciated that the preferred form of the pin captivation structure which comprises the probe tip upper part 62 and the probe tip lower part 64 (or 64A or 64B) is a light transmissive captivation structure that can readily function as a light pipe for facilitating illumination of the pin tips as they are brought into contact with the copper coating so as to help the user properly place the pin tips at the desired locations.

It will be appreciated that the probe of the present invention need not necessarily incorporate all of the features that have been so far described. For example, the probe of the present invention may include a readily removable probe tip or nose assembly 60 containing a suitable conductive member or members for engaging the coating, but the probe need not also include an LED (or other suitable light source), a light transmissive pin captivation structure, or even pins per se. Alternatively, the probe of the present invention could include a light transmissive pin captivation structure with one pin (or multiple pins) and a light source, but the probe need not also include a removable nose assembly or a special restraint structure for engaging the end of a conical tip of a pin. Similarly, the probe of the present invention may include the novel frustoconical restraint structure for the stabilization of the conical end tip of one or more pins, but the probe need not also include a removable probe nose assembly feature or an illumination feature.

It will be readily apparent from the foregoing detailed description of the invention and from the illustrations thereof that numerous variations and modifications may be effected without departing from the true spirit and scope of the novel concepts or principles of this invention.

What is claimed is:

1. A probe for providing electrical communication between a coating on a substrate and a processing system that determines an attribute of the coating, such as the thickness of the coating, by detection of phenomena resulting from the application of electrical energy to the probe in contact with the coating, said probe comprising:

a housing;

at least one contact mounted within said housing;

an electrical circuit adapted to provide electrical communication between said contact and said processing system; and at least one electrically conductive engaging member that (1) has a distal end projecting outwardly for engaging said coating, (2) has a proximal portion in said housing for engaging said at least one contact and for accommodating disengagement from said at least one contact, and (3) is captivated partially in an electrically insulating captivation structure which can be removed from said housing together with said at least one electrically conductive engaging member.

2. The probe in accordance with claim 1 in which said electrically conductive engaging member is a pin defining said distal end projecting outwardly for engaging said coating and defining said proximal portion for engaging said contact;

said captivation structure is molded from a non-conductive material having a passage in which a portion of said pin is captivated to hold said pin in a fixed orientation; and said pin and said captivation structure together define an integral unit in the form of a tip that has
(1) an inner portion that is releasably received in said housing, and
(2) an extending portion that
(a) projects from said housing, and
(b) can be manually grasped by a user for pulling said tip out of said housing without using a tool.

3. The probe in accordance with claim 2 in which
said pin includes a plunger defining said distal end;
said pin proximal portion includes a barrel that (1) is fixed in said captivation structure with a portion of said barrel exposed for engaging said contact, and (2) receives at least a portion of said plunger in a telescoping relationship to accommodate reciprocation of said plunger in said barrel; and
said pin includes a spring disposed in said barrel for biasing said plunger outwardly.

4. The probe in accordance with claim 3 in which said tip extending portion includes a peripheral platform that (1) is unitary with said captivation structure, (2) projects from said housing, and (3) extends laterally around at least a portion of the length of said plunger of said pin to provide support for said probe when said plunger is engaged with said coating and is forced against said spring further into said barrel of said pin.

5. The probe in accordance with claim 4 in which said peripheral platform defines an open viewing aperture to accommodate visual inspection of said plunger on said coating when said probe is supported by said peripheral platform over said coating.

6. The probe in accordance with claim 1 in which
said housing is a hand-holdable, tubular structure defining a receiving cavity with an access opening;
said contact includes an arm that is elastically deflectable in response to a force exerted on said arm by said proximal portion of said electrically conductive engaging member; and
a tip is releasably received in said receiving cavity of said housing and accessible at said receiving cavity access opening, said tip including said captivation structure containing said electrically conductive engaging member in the form of a pin captivated in a fixed orientation wherein said pin defines (1) said engaging member distal end projecting outwardly for engaging said coating, and (2) said engaging member proximal portion in said receiving cavity of said housing for engaging said contact.

7. The probe in accordance with claim 6 in which
said tubular structure has a peripheral wall that defines a slot having an enlarged recess and a reduced width opening to said recess; and
said tip captivation structure includes a tab having an enlarged head and a reduced width neck whereby said tab head can be forced into said enlarged recess of said slot so that said tab neck is received in said reduced width opening of said slot to create a releasable snap-fit engagement.

8. The probe in accordance with claim 1 in which said electrical circuit includes at least one conductive wire that extends from said contact within said housing and that is adapted to be connected with said processing system.

9. The probe in accordance with claim 1 in which
said housing has a receiving cavity with an access opening;
said housing defines a pair of spread-apart channels adjacent said receiving cavity of said housing;
a printed circuit board is mounted in said spaced-apart channels in said receiving cavity of said housing;
said contact is mounted on said printed circuit board;
said contact includes an elastically deflectable arm projecting from said printed circuit board;
said electrically conductive engaging member is a pin that defines said distal end projecting outwardly for engaging said coating and that defines said proximal portion for engaging said contact;
said captivation structure captivates said pin in a fixed orientation; and
said pin and said captivation structure together define an integral unit in the form of a tip that has
(1) an inner portion that is releasably received in said receiving cavity of said housing, and
(2) an extending portion that
(a) projects from said housing, and
(b) can be manually grasped by a user for pulling said tip out of said housing without using a tool.

10. A probe for providing electrical communication between a coating on a substrate and a processing system that determines an attribute of the coating, such as the thickness of the coating, by detection of phenomena resulting from the application of electrical energy to the probe in contact with the coating, said probe comprising:
a housing having a receiving cavity with an access opening;
a plurality of contacts that are mounted within said receiving cavity of said housing;
an electrical circuit adapted to provide electrical communication between said contacts and said processing system; and
a tip releasably received in said receiving cavity of said housing and accessible at said access opening of said receiving cavity, said tip including a captivation structure containing a plurality of pins captivated in a spaced-apart array wherein each said pin has (1) a distal end projecting outwardly for engaging said coating, and (2) a proximal portion in said receiving cavity of said housing for engaging one of said contacts whereby said tip can be selectively either releasably retained within said housing or manually removed therefrom.

11. The probe in accordance with claim 10 in which
said captivation structure is molded from a non-conductive material having a passage in which a portion of each said pin is captivated to hold each said pin in a fixed orientation; and
said tip has
(1) an inner portion that is releasably received in said housing, and
(2) an extending portion that
(a) projects from said housing, and
(b) can be manually grasped by a user for pulling said tip out of said housing without using a tool.

12. The probe in accordance with claim 11 in which
each said pin includes a plunger defining said distal end;
each said pin proximal portion includes a barrel that (1) is fixed in said captivation structure with a portion of said barrel exposed for engaging one of said contacts, and (2) receives at least a portion of said plunger in a telescoping relationship to accommodate reciprocation of said plunger in said barrel; and
said pin includes a spring disposed in said barrel for biasing said plunger outwardly.

13. The probe in accordance with claim 12 in which said tip extending portion includes a peripheral platform that (1) is unitary with said captivation structure, (2) projects from said housing, and (3) extends laterally around at least a portion of the length of said plunger of each said pin to provide support for said probe when said plunger is engaged with said coating and is forced against said spring further into said barrel of said pin.

14. The probe in accordance with claim 13 in which said peripheral platform defines an open viewing aperture to accommodate visual inspection of said plunger on said coating when said probe is supported by said peripheral platform over said coating.

15. The probe in accordance with claim 10 in which
said housing is a hand-holdable, tubular structure defining a receiving cavity with an access opening; and
each said contact includes an arm that is elastically deflectable in response to a force exerted on said arm by said proximal portion of one of said pins.

16. The probe in accordance with claim 10 in which
said housing has a peripheral wall that defines a slot having an enlarged recess and a reduced width opening to said recess; and
said tip captivation structure includes a tab having an enlarged head and a reduced width neck whereby said tab head can be forced into said enlarged recess of said slot so that said tab neck is received in said reduced width opening of said slot to create a releasable snap-fit engagement.

17. The probe in accordance with claim 10 in which said electrical circuit includes at least one conductive wire that extends from one of said contacts within said housing and that is adapted to be connected with said processing system.

18. The probe in accordance with claim 10 in which
said housing defines a pair of spread-apart channels adjacent said receiving cavity of said housing;
a printed circuit board is mounted in said spaced-apart channels in said receiving cavity of said housing;
each said contact is mounted on said printed circuit board; and
each said contact includes an elastically deflectable arm projecting from said printed circuit board for engaging said proximal portion of one of said pins.

19. A probe for providing electrical communication between a coating on a substrate and a processing system that determines an attribute of the coating, such as the thickness of the coating, by detection of phenomena resulting from the application of electrical energy to the probe in contact with the coating, said probe comprising:
a housing having a receiving cavity with an access opening;
at least four contacts that are mounted in a spaced-apart parallel planar array within said receiving cavity of said housing;
an electrical circuit adapted to provide electrical communication between said contacts and said processing system; and
a tip received in said receiving cavity of said housing and accessible at said access opening of said receiving cavity, said tip including a captivation structure containing four pins captivated in a spaced-apart, parallel, planar array wherein each said pin has (1) a distal end, and (2) a proximal portion, and wherein said housing and said tip together provide a snap-fit engagement structure for releasably holding at least a portion of said tip within said housing to orient said distal end of each said pin projecting outwardly for engaging said coating and to orient said proximal portion of each said pin in said receiving cavity of said housing for engaging one of said contacts whereby said snap-fit engagement structure between said housing and said tip can be released to permit manual removal of said tip from said housing.

20. The probe in accordance with claim 19 in which
said captivation structure molded from a thermoplastic material having a passage in which a portion of each said pin is captivated to hold each said pin in a fixed orientation; and
said tip has
(1) a proximal portion that is releasably received in said housing, and
(2) an extending portion that
(a) projects from said housing, and
(b) can be manually grasped by a user for pulling said tip out of said housing without using a tool.

21. The probe in accordance with claim 20 in which
each said pin includes a plunger defining said distal end;
each said pin proximal portion includes a barrel that (1) is fixed in said captivation structure with a portion of said barrel exposed for engaging one of said contacts, and (2) receives at least a portion of said plunger in a telescoping relationship to accommodate reciprocation of said plunger in said barrel; and
each said pin includes a spring disposed in said barrel for biasing said plunger outwardly.

22. The probe in accordance with claim 21 in which said tip extending portion includes a peripheral platform that (1) is unitary with said captivation structure, (2) projects from said housing, and (3) extends laterally around at least a portion of the length of said plunger of each said pin to provide support for said probe when said plunger is engaged with said coating and is forced against said spring further into said barrel of said pin.

23. The probe in accordance with claim 22 in which said peripheral platform defines an open viewing aperture to accommodate visual inspection of said plunger on said coating when said probe is supported by said peripheral platform over said coating.

24. The probe in accordance with claim 19 in which
said housing is a hand-holdable, tubular structure defining a receiving cavity with an access opening; and
each said contact includes an arm that is elastically deflectable in response to a force exerted on said arm by said proximal portion of one of said pins.

25. The probe in accordance with claim 19 in which
said housing has a peripheral wall that defines a slot having an enlarged recess and a reduced width opening to said recess; and
said tip captivation structure includes a tab having an enlarged head and a reduced width neck whereby said tab head can be forced into said enlarged recess of said slot so that said tab neck is received in said reduced width opening of said slot to create a releasable snap-fit engagement, and define said snap-fit engagement structure.

26. The probe in accordance with claim 19 in which said electrical circuit includes at least one conductive wire that extends from one of said contacts within said housing and that is adapted to be connected with said processing system.

27. The probe in accordance with claim 19 in which
said housing defines a pair of spread-apart channels adjacent said receiving cavity of said housing;
a printed circuit board is mounted in said spaced-apart channels in said receiving cavity of said housing;
each said contact is mounted on said printed circuit board; and each said contact includes an elastically deflectable arm projecting from said printed circuit board for engaging said proximal portion of one of said pins.

28. A probe for providing electrical communication between a coating on a substrate and a processing system that determines an attribute of the coating, such as the thickness of the coating, by detection of phenomena resulting from the application of electrical energy to the probe in contact with the coating, said probe comprising:

a housing having a receiving cavity with an access opening;

a light transmissive captivation structure that is mounted in said receiving cavity of said housing for communication through said receiving cavity access opening with the exterior of said probe;

at least one electrically conductive pin that (1) has a portion captivated in a fixed orientation within said light transmissive captivation structure, (2) has a distal end projecting outwardly of said light transmissive captivation structure for engaging said coating, and (3) is connected with an electrical circuit adapted to provide electrical communication with said processing system; and a light emitting source in said housing for emitting light through said light transmissive captivation structure along said pin to illuminate said pin distal end.

29. The probe in accordance with claim 28 in which said light transmissive captivation structure is molded from a thermoplastic material having a passage in which a portion of said pin is captivated to hold said pin in said fixed orientation;

said housing is a generally tubular, opaque structure;

at least one contact is mounted in said tubular, opaque structure, and said at least one contact is connected with said electrical circuit adapted to provide electrical communication with said processing system; and said pin and said light transmissive captivation structure together define an integral unit in the form of a tip that has (1) an inner portion that is received in said housing so as to effect engagement between said pin and said contact, and (2) an extending portion that projects from said housing at said receiving cavity access opening.

30. The probe in accordance with claim 29 in which said pin includes a plunger defining said distal end;

said pin includes a barrel that (1) is fixed in said light transmissive captivation structure with a portion of said barrel exposed within said receiving cavity for engaging said contact, and (2) receives at least a portion of said plunger in a telescoping relationship to accommodate reciprocation of said plunger in said barrel; and said pin includes a spring disposed in said barrel for biasing said plunger outwardly.

31. The probe in accordance with claim 30 in which said tip extending portion includes a peripheral platform that (1) is unitary with said light transmissive captivation structure, (2) projects from said housing, and (3) extends laterally around at least a portion of the length of said plunger of said pin to provide support for said probe when said plunger is engaged with said coating and is forced against said spring further into said barrel of said pin.

32. The probe in accordance with claim 31 in which said peripheral platform defines an open viewing aperture to accommodate visual inspection of said plunger on said coating when said probe is supported by said peripheral platform over said coating.

33. The probe in accordance with claim 28 in which said light transmissive captivation structure has (1) an extending portion projecting from said housing, and (2) an inner end terminating in said receiving cavity of said housing;

a printed circuit board is mounted in said housing adjacent said inner end of said light transmissive captivation structure; and said light emitting source is a light emitting diode mounted on said printed circuit board to project over said inner end of said light transmissive captivation structure for emitting light into said inner end of said light transmissive captivation structure.

34. The probe in accordance with claim 28 in which said light transmissive captivation structure is a substantially transparent polycarbonate material which functions as a light pipe for accommodating passage of light from said light emitting source toward said pin distal end.

35. The probe in accordance with claim 28 in which said light transmissive captivation structure is a substantially transparent polycarbonate material which functions as a light pipe for accommodating passage of light from said light emitting source toward said pin distal end.

36. In a probe for providing electrical communication between a coating on a substrate and a processing system wherein said processing system determines an attribute of the coating, such as the thickness of the coating, by detection of phenomena resulting from the application of electrical energy to a pin in contact with the coating, and said pin includes (1) a plunger having a shank with a conical distal end that is symmetric about a longitudinal axis and that is adapted to engage said coating, (2) a proximal portion that includes a barrel that receives at least a portion of said plunger in a telescoping relationship to accommodate reciprocation of said plunger in said barrel, and (3) a spring in said barrel for biasing said plunger outwardly;

the improvement comprising:

a captivation structure for holding said pin in a fixed orientation in said probe, said captivation structure including (a) a barrel restraining structure for restraining said barrel of said pin against axial and lateral movement; and (b) a plunger restraining structure that (1) defines a frustoconical seat about an axis that is coincident with said longitudinal axis, and (2) engages said pin plunger shank conical distal end as said plunger is biased outwardly by said spring.

37. The improvement in accordance with claim 36 in which said frustoconical seat has a conic angle substantially equal to the conic angle of said pin plunger shank conical distal end.

38. The improvement in accordance with claim 36 in which said pin plunger shank includes a cylindrical portion between said distal end and said barrel; and said captivation structure includes a cylindrical bore around said pin plunger shank cylindrical portion, said bore accommodating reciprocation of said pin plunger but limiting lateral displacement of said pin plunger shank cylindrical portion when said frustoconical seat moves away from said pin plunger shank conical distal end.

* * * * *

UNITED STATES PATENT AND TRADEMARK OFFICE
CERTIFICATE OF CORRECTION

| | | |
|---|---|---|
| PATENT NO. | : 7,148,712 B1 | Page 1 of 1 |
| APPLICATION NO. | : 11/166560 | |
| DATED | : December 12, 2006 | |
| INVENTOR(S) | : John E. Prey, Jr. and Joseph Tom | |

Figure 11:
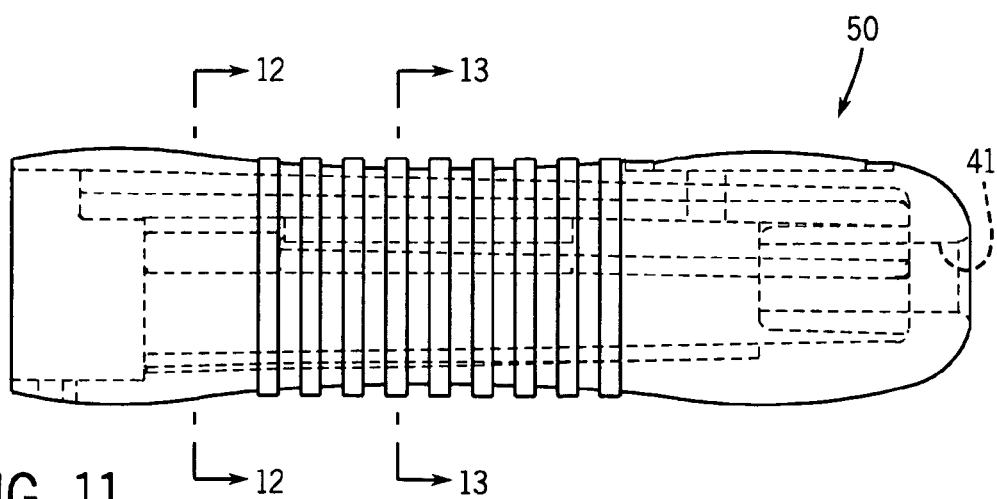
FIG. 11 is a side, elevational view of the probe housing prior to installation of any components therein.
Figure 12:
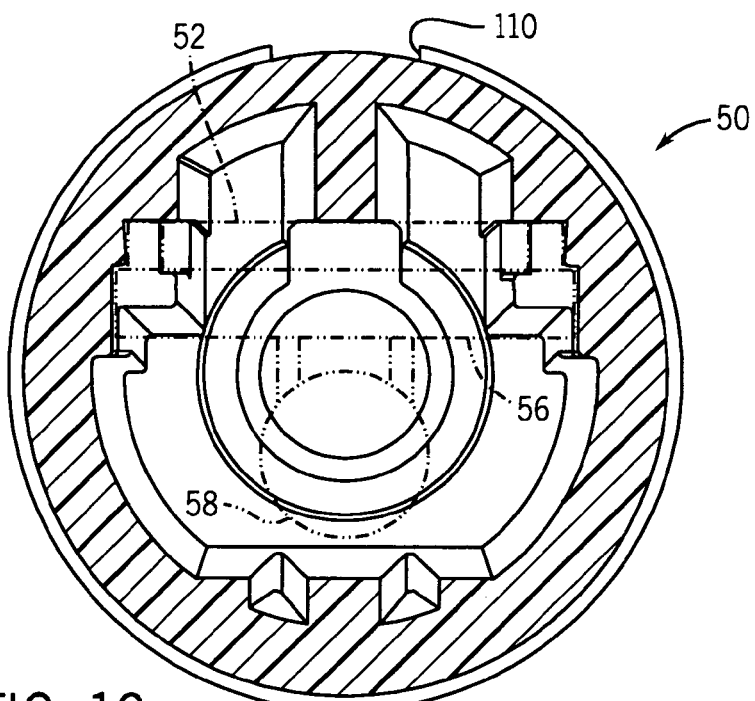
FIG. 12 is an enlarged, cross-sectional view taken generally along the plane 12—12 in FIG. 11, but FIG. 12 also shows installed internal components in phantom as represented by dot-dashed lines.

It is certified that error appears in the above-identified patent and that said Letters Patent is hereby corrected as shown below:

In column 5, line 31, "FIG. 1" should be --FIG. 11--.

Signed and Sealed this

First Day of May, 2007

JON W. DUDAS
*Director of the United States Patent and Trademark Office*